(12) United States Patent
Kadota et al.

(10) Patent No.: US 6,353,371 B1
(45) Date of Patent: Mar. 5, 2002

(54) TRANSVERSELY COUPLED RESONATOR TYPE SURFACE ACOUSTIC WAVE FILTER AND LONGITUDINALLY COUPLED RESONATOR TYPE SURFACE ACOUSTIC WAVE FILTER

(75) Inventors: Michio Kadota, Kyoto; Harou Morii, Kanazawa; Junya Ago, Nagaokakyo, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/503,542

(22) Filed: Feb. 14, 2000

(30) Foreign Application Priority Data

Mar. 8, 1999 (JP) .......................................... 11-060423

(51) Int. Cl.$^7$ .............................. H03H 9/64; H03H 9/72
(52) U.S. Cl. ........................ 333/133; 333/193; 333/195; 310/313 B; 310/313 D
(58) Field of Search ................................. 333/193–196, 333/133; 310/313 R, 313 B, 313 C, 313 D

(56) References Cited

U.S. PATENT DOCUMENTS

| 5,708,403 | A |   | 1/1998  | Morozumi et al. ......... 333/194 |
| 5,838,217 | A | * | 11/1998 | Kadota et al. ............. 333/193 |
| 5,874,868 | A | * | 2/1999  | Shimoe ..................... 333/193 |
| 5,977,686 | A | * | 11/1999 | Kadota et al. .......... 310/313 R |
| 5,986,523 | A | * | 11/1999 | Morozumi et al. ......... 333/194 |
| 6,121,860 | A | * | 9/2000  | Tsutsumi et al. ........... 333/195 |
| 6,154,105 | A | * | 11/2000 | Fujimoto et al. ........... 333/194 |

FOREIGN PATENT DOCUMENTS

| DE | 197 14 085 A  | 11/1997 |
| DE | 198 38 573 A 1 | 3/1999 |
| EP | O 782 255 A2   | 7/1997 |
| EP | 0 854 571 A    | 7/1998 |

OTHER PUBLICATIONS

Michio Kadota, et al.; Ceramic Resonators Using BGS Waves; Japanese Journal of Applied Physics, Publication Office Japanese Journal of Applied Physics, Tokyo, JP, vol. 31, No. Suppl 31–1, 1992, pp 219–221.

* cited by examiner

Primary Examiner—Robert Pascal
Assistant Examiner—Barbara Summons
(74) Attorney, Agent, or Firm—Keating & Bennett, LLP

(57) ABSTRACT

A transversely coupled surface acoustic wave filter includes a surface acoustic wave substrate having opposing first and second end surfaces, and first and second interdigital transducers provided on the surface acoustic wave substrate. The first and second interdigital transducers define first and second surface acoustic wave resonators which use a wave including a shear horizontal wave as its main component. The first and second surface acoustic wave resonators are connected to define a transversally coupled resonator filter. The filter preferably has a relative dielectric constant $E = \epsilon^s_{11}/\epsilon_0$ in the range of about 0 to about 3000 and the electromechanical coupling coefficient K is such that $K^2 \cdot \epsilon^s_{11/\epsilon 0}$ is in the range of about 0 to about 250. Also, the aperture length y is preferably within the range of: $0.945 + 5.49 \times \exp(-E/366) \geq y \geq 2.46 \times \exp(-E/219)$.

34 Claims, 13 Drawing Sheets

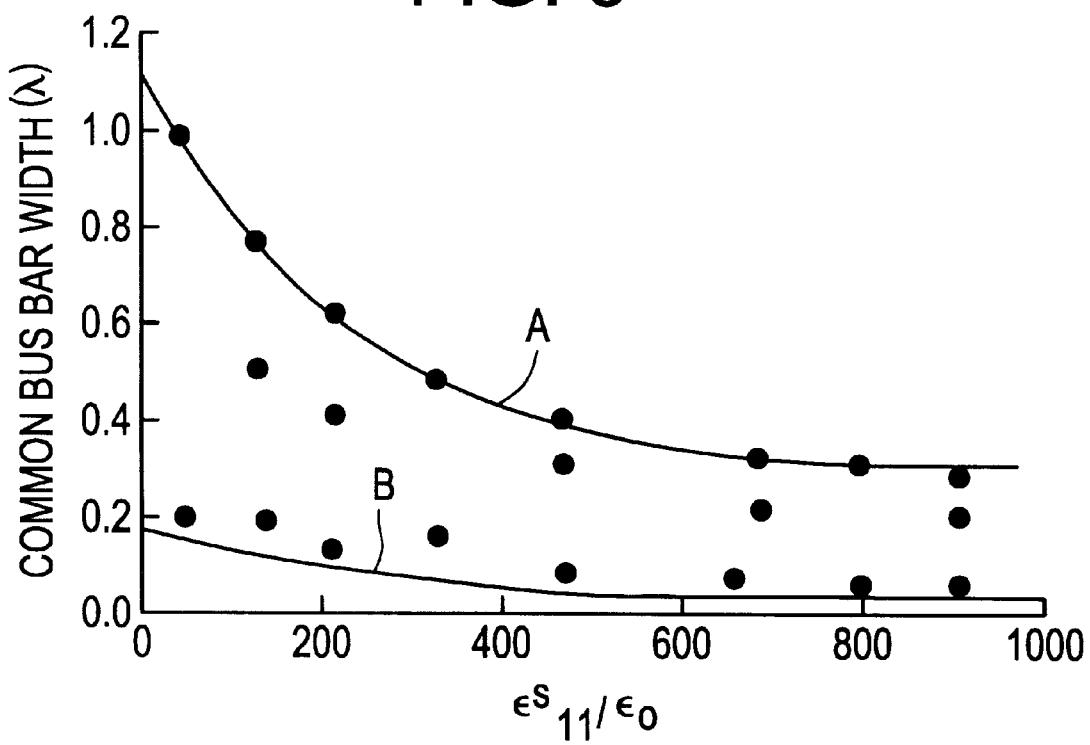
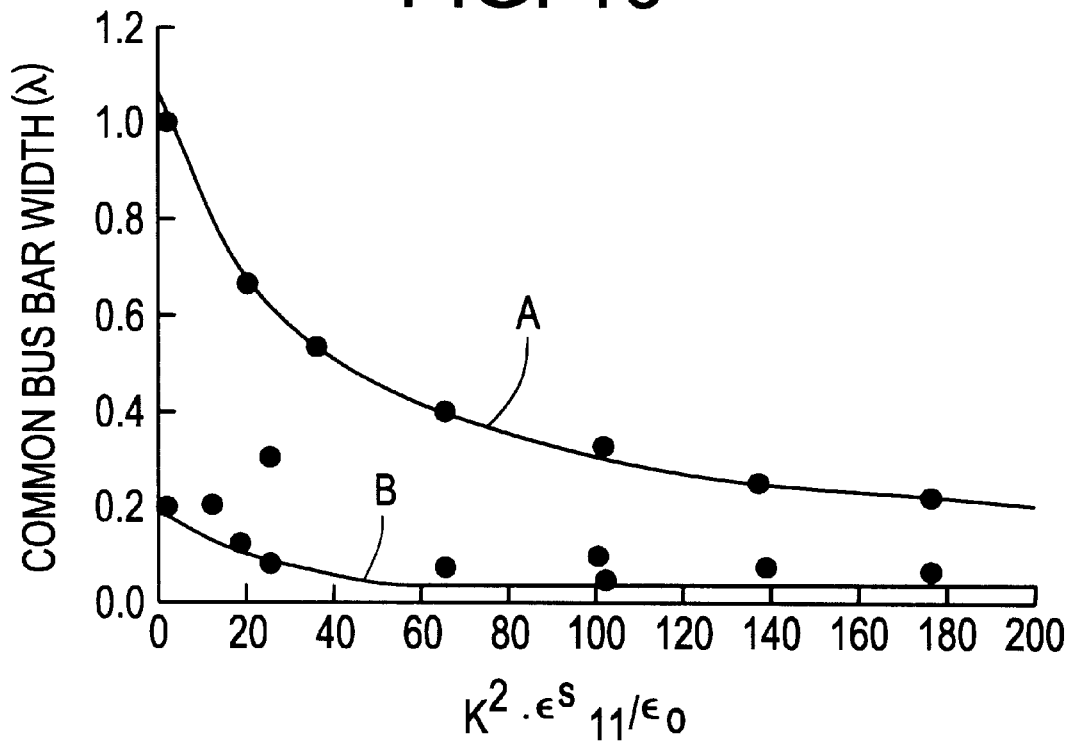

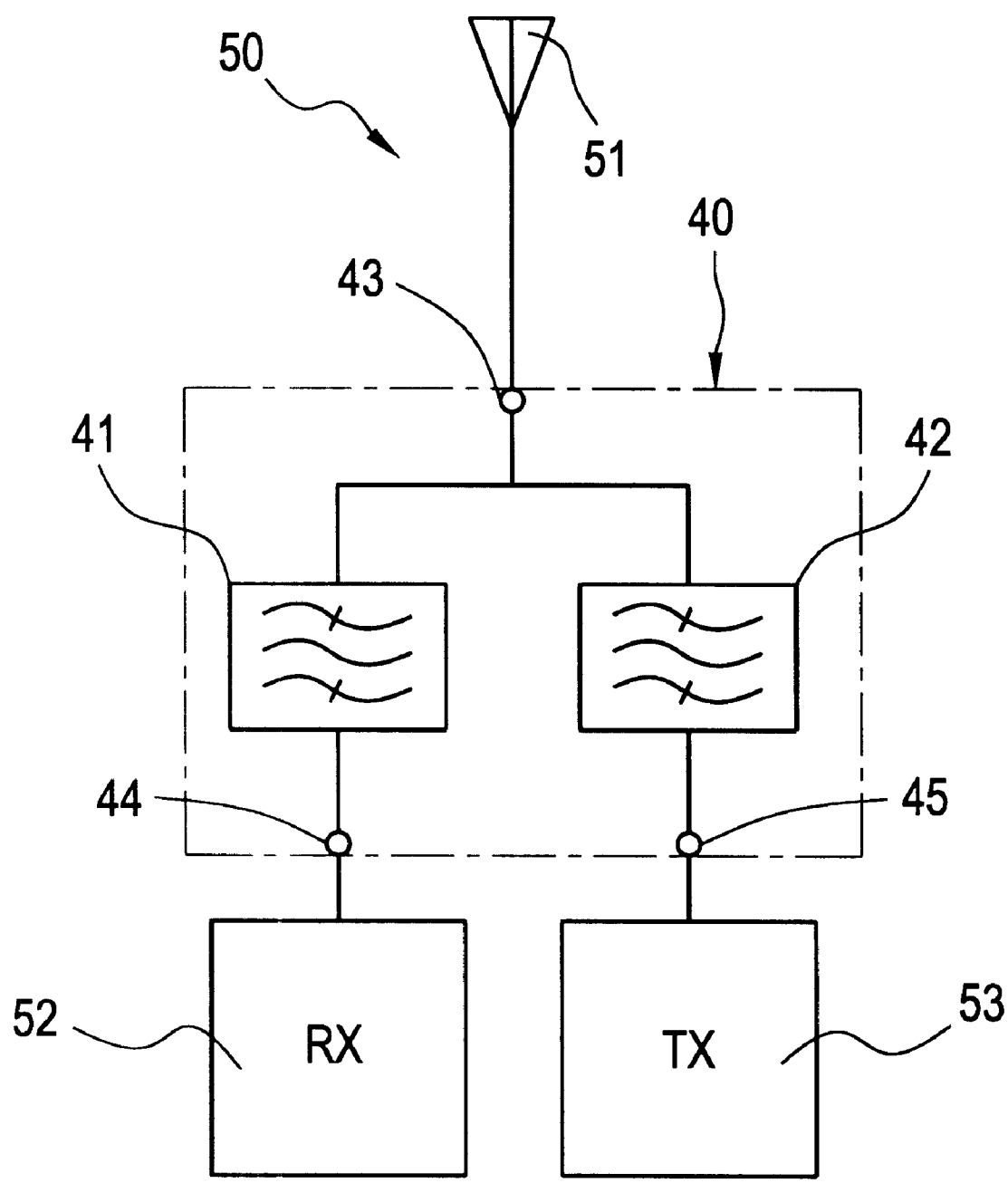

TRANSVERSELY COUPLED RESONATOR TYPE SURFACE ACOUSTIC WAVE FILTER AND LONGITUDINALLY COUPLED RESONATOR TYPE SURFACE ACOUSTIC WAVE FILTER

BACKGROUND OF THE INVENTION

1. Field of the Invention

The present invention relates to a resonator type surface acoustic wave filter used as, for example, a bandpass filter or other type of filter. More specifically, the present invention relates to a resonator type surface acoustic wave filter including a plurality of transversely or longitudinally coupled surface acoustic wave resonators which generates and uses a surface acoustic wave that has a Shear Horizontal (SH) wave as its main component, such as, a Bleustein-Gulyaev-Shimizu (BGS) wave.

2. Description of the Related Art

Various conventional surface acoustic wave filters are known bandpass filters. For example, a transversely coupled surface acoustic wave filter using a Rayleigh wave as a surface acoustic wave, and transversely coupled and longitudinally coupled resonator filters using a Rayleigh wave are already known bandpass filters.

The transverse type surface acoustic wave filter is constructed such that a fixed distance separates a pair of interdigital transducers (IDTs) from each other on a surface acoustic wave substrate.

Further, in the transversely coupled resonator filter using a Rayleigh wave, a plurality of surface acoustic wave resonators include a plurality of IDTs that are provided on a surface acoustic wave substrate with the plurality of surface acoustic wave resonators coupled in the transverse direction. In the transversely coupled resonator filter, reflectors are located on both sides of an area occupied by the IDTs.

Recently, an edge reflection type surface acoustic wave filter using and SH type surface acoustic wave such as a BGS wave has been developed because the filter has the advantage of being compact.

In a transversely coupled surface acoustic wave filter using the Rayleigh wave, because two sets of IDTs are separated by a fixed distance along the direction of the surface-wave transmission on a surface acoustic wave substrate, the size of the filter cannot be reduced and is instead much larger. Also, the insertion loss is very large.

In a transversely coupled resonator filter using a Rayleigh wave, because the electromechanical coupling coefficient K is small, the filter does not have sufficient bandwidth, and although the loss can be reduced, the aperture of the electrode fingers of the IDT is about $10\lambda$ and the coupling length is about $1.5\lambda$ assuming that the wavelength of the surface acoustic wave is B. Additionally, reflectors, as described above, are required. Accordingly, the size of the filter cannot be reduced and made compact.

Further, in an edge reflection type surface acoustic wave resonator using a SH type surface acoustic wave, a resonator with a wide bandwidth is obtained, which is due to the relatively large electromechanical coupling coefficient K, so that no reflectors are required. Further, the edge reflection type resonator is favorable because it can be made compact. However, up until now, when a SH type surface acoustic wave was used, the construction of a filter by coupling the plurality of surface acoustic wave resonators was considered to be impossible.

SUMMARY OF THE INVENTION

To overcome the problems of the related art described above, preferred embodiments of the present invention provide a resonator type surface acoustic wave filter constructed so as to make use of a SH type surface acoustic wave, particularly a BGS wave, and which is miniaturized and compact size with very small insertion loss.

A transversely coupled resonator type surface acoustic wave filter according to a preferred embodiment of the present invention includes a surface acoustic wave substrate having opposing first and second end surfaces, first and second surface acoustic wave resonators on the surface acoustic wave substrate, and which utilizes a surface acoustic wave having an SH wave as a main component, and the first and second surface acoustic wave resonators are coupled to constitute a stage of the transversely coupled resonator filter, wherein the first and second surface acoustic wave resonators include first and second interdigital transducers, the first and second interdigital transducers defined by a first bus bar, a second bus bar and a common bus bar all arranged so as to be substantially parallel to each other and extending in a direction of transmission of the surface acoustic wave, the common bus bar is located between the first and second bus bars, and a plurality of electrode fingers are connected to the first and second bus bars at a first end of the electrode fingers and extended towards the common bus bar, a plurality of electrode fingers are connected to the common bus bar at a first end of the electrode fingers and such that a first set of electrode fingers of the common bus bar are extended towards the first bus bar and a second set of electrode fingers are extended towards the second bus bar so that the first and second sets of electrode fingers of the common bus bar interdigitate with the electrode fingers of the first and second bus bars, wherein the surface acoustic wave substrate has a relative dielectric constant E along the direction of 11 of the surface acoustic wave substrate such that $E = \epsilon^s_{11}/\epsilon_0$, and where E is in a range of about 0 to about 3000, wherein an aperture y of the interdigital transducer is defined as an amount of overlap between the electrode fingers of the common bus bar with the electrode fingers of the first and second bus bars normalized by a wavelength $\lambda$ of the surface acoustic wave, and wherein the filter is constructed such that y satisfies a formula:

$$0.945 + 5.49 \times \exp(-E/366) \geq y \geq 2.46 \times \exp(-E/219) \quad (1)$$

Also, when K is an electromechanical coupling coefficient of the surface acoustic wave substrate, the filter is preferably arranged such that $F = K^2 \cdot \epsilon^s_{11/\epsilon_0}$, and F is in the range of about 0 to about 250 and the aperture y of the interdigital transducer satisfies the following formula:

$$1.40 + 4.14 \times \exp(-F/46) \geq y \geq 0.25 + 0.97 \times \exp(-F/42) \quad (2)$$

Further, in a transversely coupled resonator type surface acoustic wave filter, preferably, the coupling length x, which is normalized by the wavelength $\lambda$ of the surface acoustic wave, satisfies the following formula:

$$0.71 + 1.72 \times \exp(-E/251) \geq x \geq 0.045 + 0.16 \times \exp(-E/418) \quad (3)$$

Preferably, if the filter is constructed so that $F = K^2 \cdot \epsilon^s_{11}/\epsilon_0$ is in the range of about 0 to about 250 then the coupling length x preferably satisfies the following formula:

$$0.452 + 1.953 \times \exp(-F/49.56) \geq x \geq 0.269 \times \exp(-F/32) \quad (4)$$

Further, one bus bar of each of the first and second surface acoustic wave resonators is made a common bus bar and the width W of the common bus bar preferably satisfies the following formula:

$$0.32+0.853\times\exp(-E/222) \geq W \geq 0.017+0.157\times\exp(-E/245) \quad (5)$$

Also, if the filter is constructed so that $K^2 \cdot \in^s_{11}/\in_0$ is in the range of about 0 to about 250, then the width W of the common bus bar of the first and second surface acoustic wave resonators preferably satisfies the following formula:

$$0.22+0.84\times\exp(-F/43) \geq W \geq 0.03+0.14\times\exp(-F/21) \quad (6)$$

Further, the filter is preferably constructed so that the gap width G between the common bus bar and the tip of a plurality of electrode fingers extending from the other bus bars meets the following formula:

$$1.19+4.51\times10^{-4}\times E-1.34\times10^{-6}\times E^2 \geq G \geq -0.115+0.29\times\exp(-E/1150) \quad (7)$$

Also, if the filter is constructed so that $F=K^2 \cdot \in^s_{11}/\in_0$ is in the range of about 0 to about 250, then the gap width G preferably meets the following formula:

$$1.125-0.003\times F-1.016\times10^{-6}\times F^2 \geq G \geq -0.107+0.26\times\exp(-F/250) \quad (8)$$

Moreover, the outside gap G' is also preferably made approximately equal to G.

In a resonator type surface acoustic wave filter, preferably an edge reflection type surface acoustic wave filter that makes use of reflection at the end surface of a substrate is constructed.

Further, the resonator type surface acoustic wave filter of preferred embodiments may include one stage or a plurality of stages.

In another preferred embodiment of the present invention, a longitudinally coupled resonator type surface acoustic wave filter includes a surface acoustic wave substrate, and first and second surface acoustic wave resonators provided on the surface acoustic wave substrate and utilizing a surface acoustic wave having an SH wave as a main component, and the first and second surface acoustic wave resonators are coupled to constitute a stage of the longitudinally coupled resonator filter, wherein the first and second surface acoustic wave resonators include first and second interdigital transducers arranged in the direction of transmission of the surface accustic wave on the surface acoustic wave substrate, respectively, each of the interdligital transducers defined by first and second comb electrodes having a first bus bar and a second bus bar, respectively, and such that the bus bars are extended in the direction of the transmission of the surface acoustic wave, and each of the bus bars, are connected to a first end of a plurality of electrode fingers such that a second end of the electrode fingers of the first bus bar is extended towards the second bus bar and a second end of the electrode fingers of the second bus bar are extended towards the first bus bar such that the electrode fingers of the first and second bus bars interdigitate with each other, wherein the surface acoustic wave substrate has a relative dielectric constant E such that $E=\in^s_{11}/\in_0$, and where E is in a range of about 0 to about :3000, wherein an aperture Y is defined as an amount of overlap between the electrode fingers of the first bus bar and the second bus bar normalized by a wavelength λ of the surface acoustic wave, and wherein Y satisfies a formula:

$$5.52+66.62\times\exp(-E/110) \geq Y \geq 0.80+3.48\times\exp(-E/404) \quad (9)$$

Also, when K is the electromechanical coupling coefficient of the surface acoustic wave substrate, preferably $F=K^2 \cdot \in^s_{11}/\in_0$ is in the range of about 0 to about 250 and the aperture Y preferably satisfies the following formula:

$$7.96+44.14\times\exp(-F/38.3) \geq Y \geq 0.40+4.35\times\exp(-F/80) \quad (10)$$

Further, the filter is preferably constructed so that the number of pairs N of electrode fingers of the first and second interdigital transducers satisfies the following formula:

$$114.4+0.02\times E-9.283\times10^{-5}\times E^2 \geq N \geq 2.0 \quad (11)$$

Alternatively, if the filter is constructed so that $F=K^2 \cdot \in^s_{11}/\in_0$ is in the range of about 0 to about 250, then the number of pairs of electrode fingers N of the first and second interdigital transducers preferably satisfies the following formula:

$$-171+292\times\exp(-F/672) \geq N \geq 2.0 \quad (12)$$

Additionally, the distance X, which is the separation between adjacent electrode fingers of the first and second transducers preferably satisfies the following formula:

$$-5.423+5.994\times\exp(-E/22894) \geq X \geq 0.255-0.19\times\exp(-E/446) \quad (13)$$

Also, if the filter is constructed so that $F=K^2 \cdot \in^s_{11}/\in_0$ is in the range of about 0 to about 250, then the distance X preferably satisfies the following formula:

$$0.364+0.198\times\exp(-F/67.5) \geq X \geq 0.241-0.169\times\exp(-F/58.1) \quad (14)$$

Further, a longitudinally coupled resonator type surface acoustic wave filter is preferably constructed as an edge reflection type surface acoustic wave filter that makes use of reflection at a pair of opposing end surfaces of a surface acoustic wave substrate.

In the transversely coupled resonator filter, because the aperture y of the IDT is arranged to be in a certain range and $\in^s_{11}/\in_0$ is in the range of about 0 to about 3000, excellent resonance characteristics are achieved. That is, it is possible to provide a transversely coupled edge reflection type resonator filter that makes use of a BGS wave, although it has been heretofore been thought to be impossible.

Also, because the filter is a resonator type surface acoustic wave filter of edge reflection type, reflectors are not required, and accordingly, it is possible to achieve a small-sized surface acoustic wave filter. Therefore, preferred embodiments of the present invention provide a surface acoustic wave filter having excellent filter characteristics while being compact.

Further, by satisfying the given ranges for the aperture, coupling length, width of the common bus bar, and gap width in accordance with $\in^s_{11}/\in_0$ and $K^2 \cdot \in^s_{11}/\in_0$, greatly improved filter characteristics are achieved. Also, because the reflectance ratio and reflection efficiency are high compared with those in the reflector of electrode fingers, a low-loss and wideband filter can be realized.

In the longitudinally coupled resonator filter, first and second surface acoustic wave resonators that makes use of a BGS wave is constructed. And as $\in^s_{11}/\in_0$ is in the range of about 0 to 3000 and the aperture Y is made so as to within a certain range, excellent filter characteristics can be obtained.

Particularly, when $K^2 \cdot \in^s_{11}/\in_0$ is in the range of about 0 to about 250 and the aperture Y is within a certain range, the number of pairs of electrode fingers of the first and second IDTs are within the desired range, and the distance X between adjacent electrode fingers of the first and second IDTs are a desired distance, greatly improved filter characteristics are achieved.

In another preferred embodiment of the present invention, a communication apparatus having a duplexer includes the above described longitudinally coupled surface acoustic wave resonator filter or a transversely coupled surface acoustic wave resonator filter.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood form the detailed description given herein below and the accompanying drawings which are given by way of illustration only, and thus do not limit the present invention and wherein:

FIG. 9 shows the relationship between the relative dielectric constant $\varepsilon^s_{11}/\varepsilon_0$ and the width of the common bus bar in a transversely coupled resonator type surface acoustic wave filter;

FIG. 10 shows the relationship between $K^2 \cdot \varepsilon^s_{11}/\varepsilon_0$ and the width of the common bus bar in a transversely coupled resonator type surface acoustic wave filter;

FIG. 20 is a block diagram of a duplexer and a communication apparatus according to another preferred embodiment of the present invention.

DETAILED DESCRIPTION OF PREFERRED EMBODIMENTS

Figure 1B:
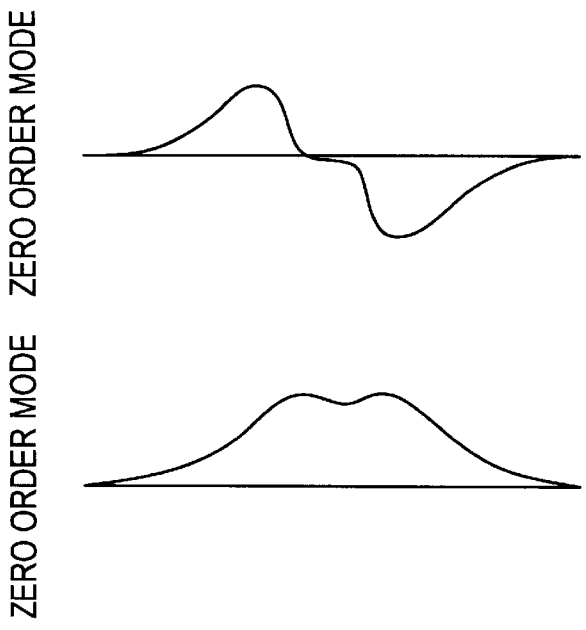
FIG. 1B is a graph illustrating the mode of a surface acoustic wave used for excitation.
Figure 1A:
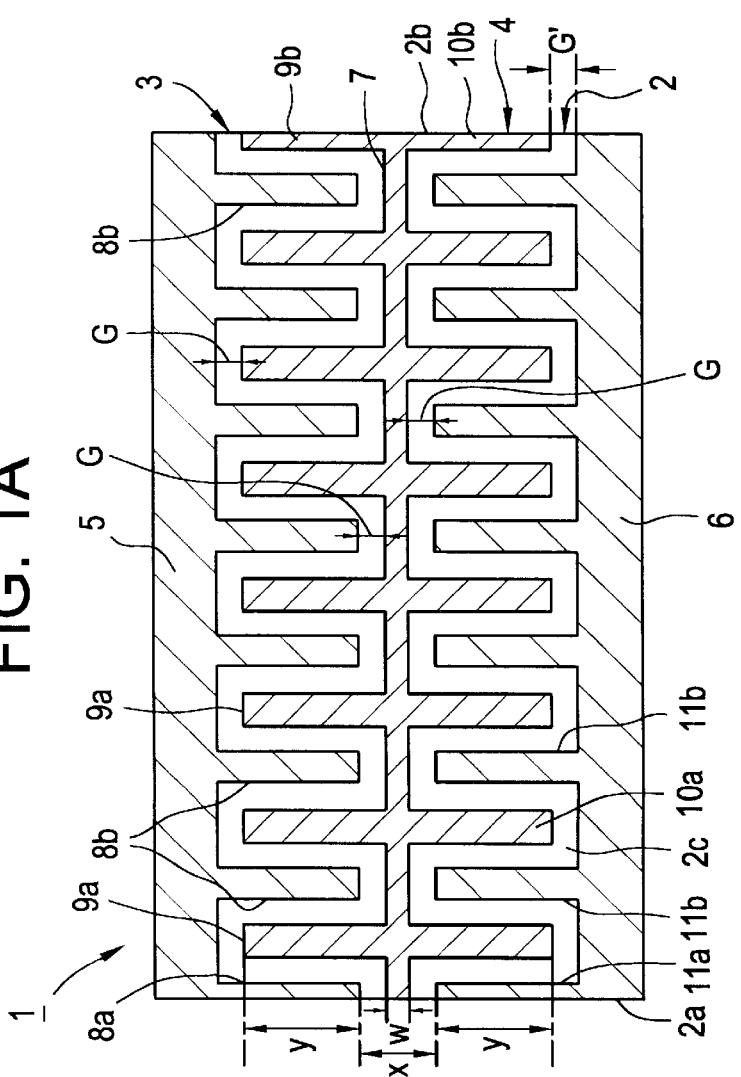
FIG. 1A is a plan view of a resonator type surface acoustic wave filter according to a first preferred embodiment of the present invention.

FIG. 1A is a plan view of a resonator type surface acoustic wave filter according to a first preferred embodiment of the present invention, and FIG. 1B is a graph illustrating the modes of a surface acoustic wave generated in the filter of FIG. 1A. The two coupled modes constitute a filter.

The resonator type surface acoustic wave filter 1 is constructed preferably using a substantially rectangular surface acoustic wave substrate 2.

The surface acoustic wave substrate 2 is preferably constructed using a piezoelectric substrate made up of piezoelectric material or by laminating thin films, such as ZnO thin films, on the substrate. In making the piezoelectric substrate, a piezoelectric single crystal such as LiTaO$_3$, LiNbO$_3$, or quartz, or piezoelectric ceramics such as lead titanate and zirconate type ceramics may be used. Further, when the surface acoustic wave substrate 2 is constructed by providing a thin film on the substrate, a thin film made of piezoelectric material such as ZnO, Ta$_2$O$_3$, and other similar materials is laminated on an appropriate insulating substrate such as alumina, sapphire, Si, and other similar materials. Alternatively, a piezoelectric substrate such as LiNbO$_3$, quartz, and other similar materials, and a thin film such as Au and other similar materials laminated on a piezoelectric substrate can be used. Note that when a surface acoustic wave substrate is constructed by laminating a piezoelectric thin film on the substrate, the IDTs are provided on the upper or lower surface of the piezoelectric thin film.

In the resonator type surface acoustic wave filter 1, IDTs, 3 and 4, are provided on the upper surface of the surface acoustic wave substrate 2. According to the present preferred embodiment, a first surface acoustic wave resonator is defined by the IDT 3 and a second surface acoustic wave resonator is defined by the IDT 4, and the first and second surface acoustic wave resonators are coupled laterally, that is, in a direction that is substantially perpendicular to the direction of the surface acoustic wave transmission.

The IDTs, 3 and 4, which constitute the above-described first and second surface acoustic wave resonators, are explained in detail below. Two bus bars, 5 and 6, which extend in the direction of the surface acoustic wave transmission, are provided on the surface acoustic wave substrate 2. Also, a common bus bar 7 is provided between the two bus bars, 5 and 6. The common bus bar 7 is also extended in the direction of the surface acoustic wave transmission. A plurality of electrode fingers, 8a and 8b, are connected to the bus bar 5, and the electrode fingers, 8a and 8b, are extended towards the bus bar 7 in a direction that is substantially perpendicular to the direction of the surface acoustic wave transmission. Also, a plurality of electrode fingers, 9a and 9b are connected to the common bus bar 7, and are extended in a direction that is substantially perpendicular to the direction of the surface acoustic wave transmission. The electrode fingers, 9a and 9b, are extended toward the side of the bus bar 5. The electrode fingers, 8a and 8b, and the electrode fingers, 9a and 9b, are arranged to be interdigitated.

Additionally, a plurality of electrode fingers, 10a and 10b are connected to the common bus bar 7 and to the side of the bus bar 6 such that the electrode fingers 10a and 10b are extended in a direction that is substantially perpendicular to the direction of the surface acoustic wave transmission. Also, a plurality of electrode fingers, 11a and 11b, are connected to the bus bar 6. The electrode fingers, 11a and 11b, are extended toward the side of the bus bar 7, and arranged so as to be interdigitated with the electrode fingers, 10a and 10b. In the portion where the electrode fingers, 10a and 10b, and electrode fingers, 11a and 11b, are provided, the second IDT 4 is constructed.

The tips of the electrode fingers, 8a, 8b and 11a, 11b, of the first and second IDTs, 3 and 4, respectively, are separated by a coupling length x from each other in a direction that is substantially perpendicular to the direction of the surface acoustic wave transmission. Here, the coupling length x means a distance in a direction that is substantially perpendicular with respect to the direction of the surface acoustic wave transmission, between the area where the electrode fingers in the one IDT 3 are interdigitally inserted and the area where the electrode fingers in the other IDT 4 are interdigitally inserted.

Further, the electrode finger interdigital insertion area means an area where the electrodes, 8a, 8b, 9a, and 9b, overlap with each other in the surface acoustic wave transmission direction in the IDT 3. The electrode finger interdigital insertion area in the IDT 4 means the same.

Further, an electrode finger aperture y means the length of the above-described electrode finger of the interdigital insertion area in the IDTs, 3 and 4 in a substantially perpendicular direction relative to the direction of the surface acoustic wave transmission. The aperture may be referred to as an IDT finger overlap length or simply as an overlap length.

In the IDTs, 3 and 4, the distance between the tip of the electrode fingers, 8a and 8b, and the facing bus bar 5 is expressed by the gap length G.

The width of the outermost electrode fingers, 8a, 9b, 10a, and 11b, in the surface acoustic wave transmission direction, out of the above electrode fingers, 8a, 8b through 11a and 11b, is preferably about $\lambda/8$, and the width of the rest of the electrode fingers, 8b, 9a, 10b, and 11a is preferably about $\lambda/4$. Further, all of the dimensions of the area between adjacent electrode fingers in the surface acoustic wave transmission direction are preferably about $\lambda/4$.

The electrode fingers, 8a and 11a, are preferably arranged to extend along an edge defined at the intersection of the end surface 2a and upper surface 2c of the surface acoustic wave substrate 2. Similarly, the electrode fingers, 9b and 10b, are arranged so as to extend along an edge defined by the intersection of the end surface 2b opposed to the end surface 2a and the upper surface 2c.

That is, the first and second IDTs, 3 and 4, constitute a surface acoustic wave resonator of edge reflection type making use of a BGS wave, respectively.

The IDTs, 3 and 4, can be constructed by patterning a metal film such as aluminum or other similar materials.

The resonator type surface acoustic wave filter 1 according to the present preferred embodiment makes use of a BGS wave. For example, by inputting an input signal between the common bus bar 7 and bus bar 5 an output signal can be taken out between the common bus bar 7 and bus bar 6. In this case, when an input signal is applied, the surface acoustic wave filter 1 generates zero-order mode and first-order mode vibrations and the combination of both makes the surface acoustic wave filter 1 function as a transversely coupled resonator type filter.

Further, because the first and second IDTs, 3 and 4, constitute an edge reflection type surface acoustic wave resonator, respectively, that is, as the resonator taupe surface acoustic wave filter 1 has an edge reflection type construction, no reflector is required. Accordingly, it is possible to make a compact surface acoustic wave filter.

Further, in the resonator type surface acoustic wave filter 1 of the present preferred embodiment, by choosing the most appropriate aperture, coupling length, common bus bar, and gap width in accordance with the value of the relative dielectric constant $\epsilon^s_{11}/\epsilon_0$ or $K^2 \cdot \epsilon^s_{11}/\epsilon_0$ in the direction of 11 of the above surface acoustic wave substrate 2 where the distortion is constant, the first and second surface acoustic wave resonators are laterally coupled and excellent filter characteristics can be obtained. Moreover, $K^2$ is an electromechanical coupling coefficient of the surface acoustic wave substrate, and the above gap width means the distance between the tip of electrode fingers and the facing bus bar. That is, when the electrode finger of 9A is taken as an example, the dimension in the direction normal to the surface acoustic wave transmission direction between the tip of the electrode finger 9a and bus bar 5 becomes a gap width of G.

Hereinafter, this is explained based on the following experimental example.

As the above transversely coupled surface acoustic wave resonator filter 1, various surface acoustic wave filters 1 were produced by forming IDTs, 3 and 4, having electrode finger apertures variously changed on the surface acoustic wave substrate 2 of $\epsilon^s_{11}/\epsilon_0$=470, $K^2 \cdot \epsilon^s_{11}/\epsilon_0$=25, and a piezoelectric ceramic having approximate dimensions of 2.1 mm×1.5 mm×0.5 mm. Moreover, in all of the filters, the center frequency, coupling length, and gap width were set to be 49 MHz, $0.6\lambda$, and $0.2\lambda$, respectively.

Figure 2:
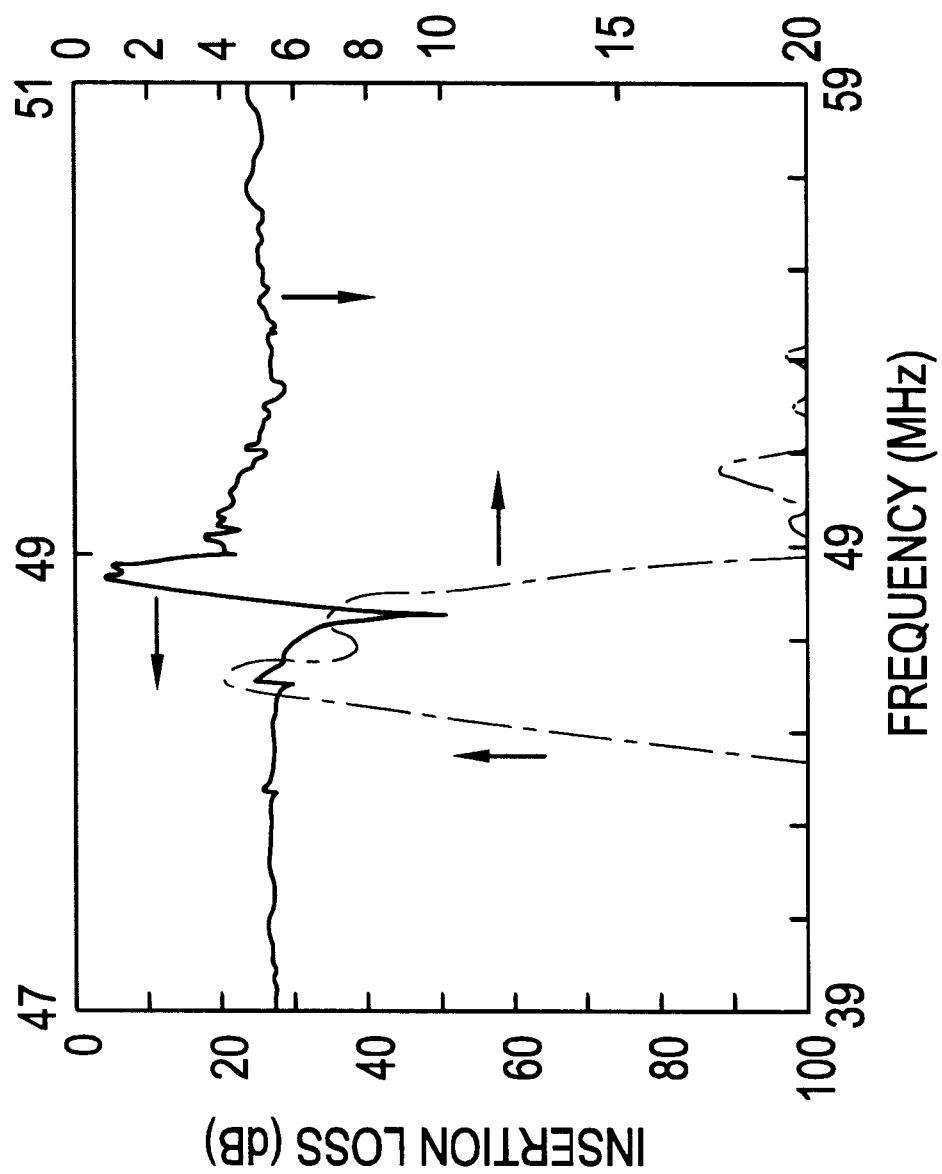
FIG. 2 shows the impedance vs. frequency characteristics of a transversely coupled resonator type surface acoustic wave filter where the aperture of the electrode fingers is 4.0λ.
Figure 3:
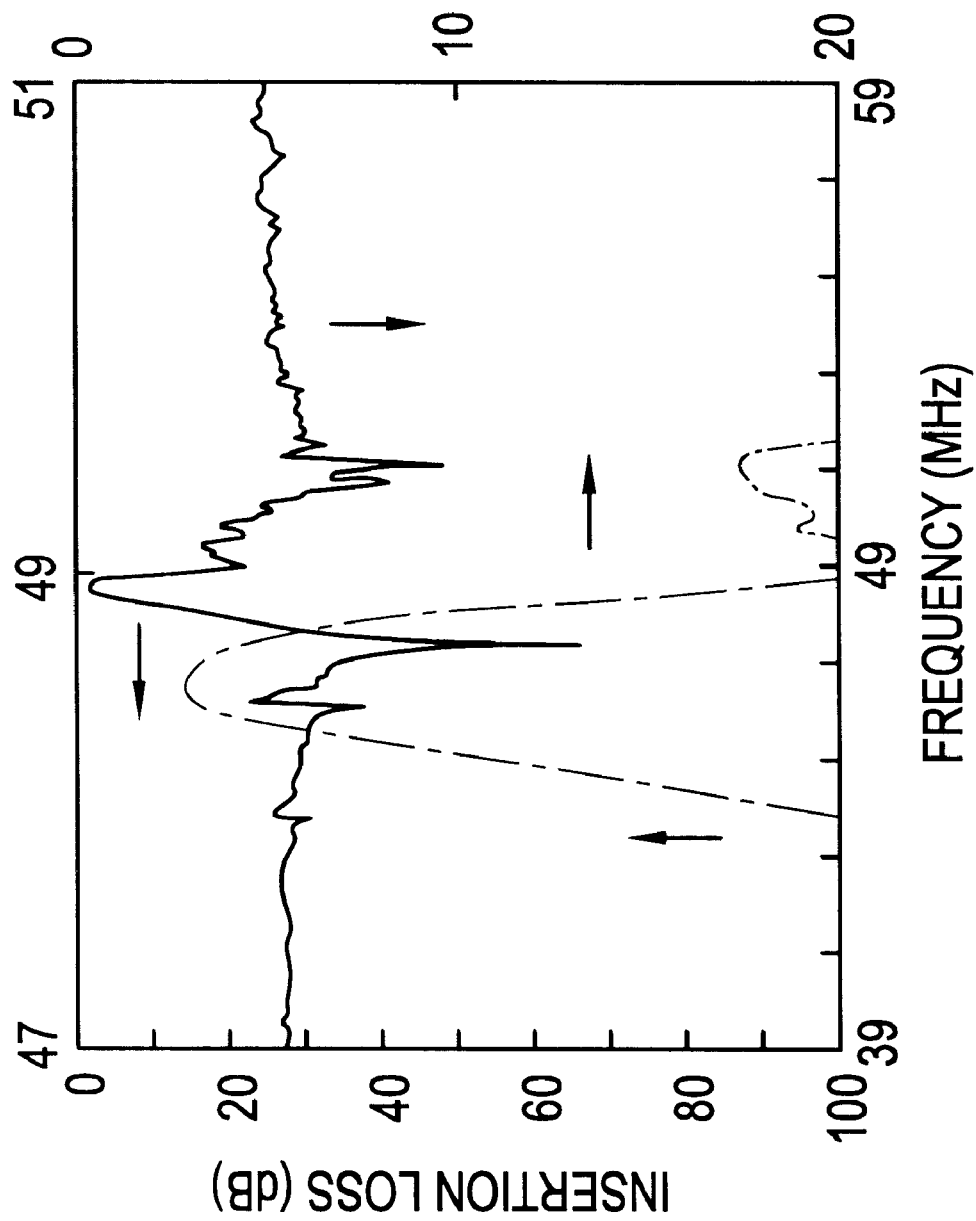
FIG. 3 shows the impedance vs. frequency characteristics of a transversely coupled resonator type surface acoustic wave filter where the aperture of the electrode fingers is 1.5λ.
Figure 4:
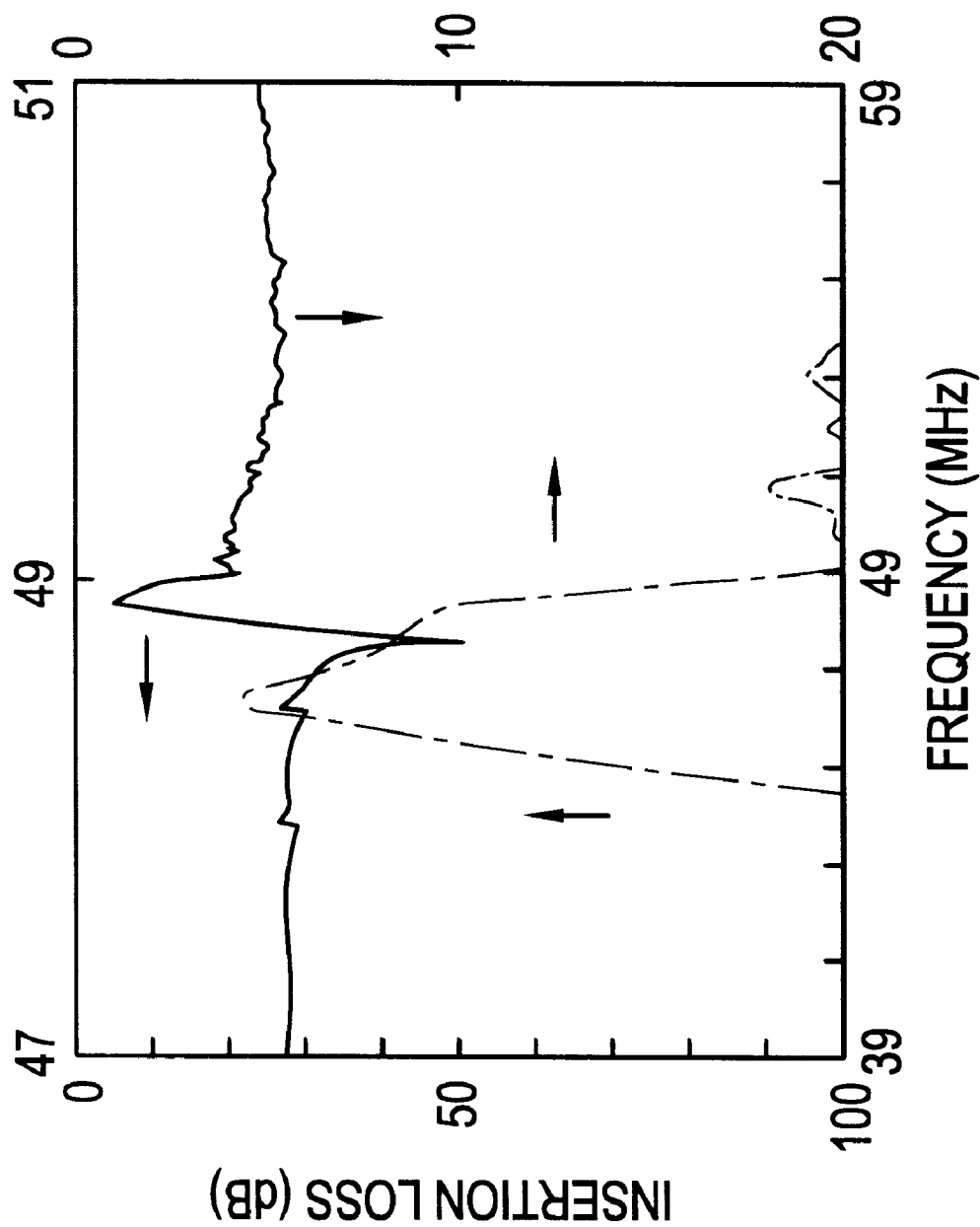
FIG. 4 shows the impedance vs. frequency characteristics of a transversely coupled resonator type surface acoustic wave filter where the aperture of the electrode fingers is 0.3λ.

In FIGS. 2 through 4, the frequency characteristic of these resonator type surface acoustic wave filters is shown. FIG. 2 shows the frequency characteristic when the electrode finger aperture length in the IDTs, 3 and 4, is $4\lambda$. FIG. 3 shows the case where the aperture length is $1.5\lambda$, and FIG. 4 shows the case when aperture length is $0.3\lambda$. Moreover, in FIGS. 2 through 4, the one-dot chain line shows the expansion in the axis of frequency and amplitude of the characteristic shown by a broken line.

Figure 5:
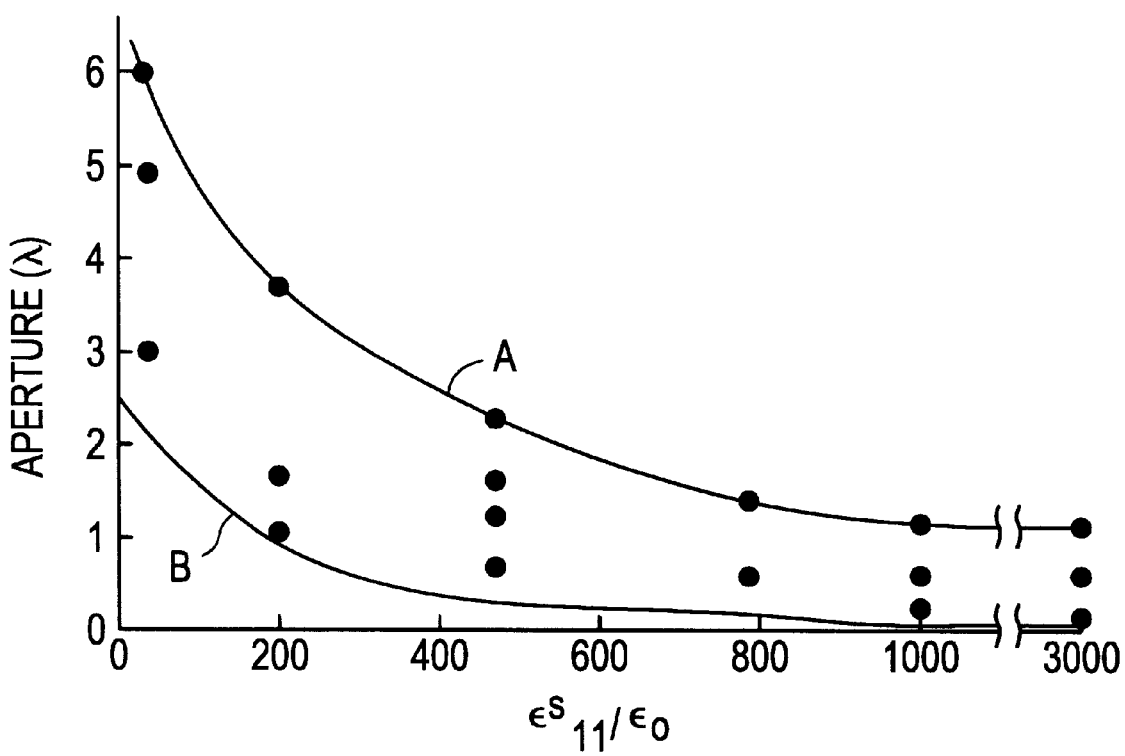
FIG. 5 shows the relationship between the relative dielectric constant $\varepsilon^s_{11}/\varepsilon_0$ and the aperture length in a transversely coupled resonator type surface acoustic wave filler.

As is clearly seen in FIGS. 2 through 4, in the case where the electrode finger aperture length is $1.5\lambda$, that is, which is within the range showing a good characteristic as in FIG. 5, which is to be described later, because the transverse mode coupling is good, good frequency characteristics are obtained, but in the case of $4\lambda$, good characteristics are not obtained. In the case where electrode finger aperture length is $0.3\lambda$ in FIG. 4, a certain characteristic is obtained, but it is as good as the characteristics shown in FIG. 3. This is because the condition is outside the range in which good characteristics, as shown in FIG. 5, can be obtained.

Next, using various materials as shown in the following Table 1 as a piezoelectric material constituting a surface acoustic wave substrate 2, the condition when good filter characteristics as shown in FIG. 3 can be obtained was examined. That is, by using various surface acoustic wave substrates 2 and changing the coupling length x, electrode finger aperture length y, width of the common bus bar 7, and gap width G in various ways, these optimum values were sought.

TABLE 1

| Material | | $\epsilon_{11}^s/\epsilon_0$ | K | $K^2 \cdot \epsilon_{11}^s/\epsilon_0$ |
| --- | --- | --- | --- | --- |
| Piezoelectric | A | 470 | 0.23 | 25 |
| ceramic | B | 800 | 0.47 | 177 |
| | C | 205 | 0.18 | 6.6 |
| | D | 1000 | 0.51 | 260 |
| LiTaO$_3$ | | 43 | 0.22 | 2.1 |

Piezoelectric ceramic Pb(Zr$_x$Ti(1-x))O$_3$
A x = 0.38
B x = 0.48
C x = 0.34
D x = 0.53

The result is shown in FIGS. 5 through 12. FIG. 5 shows the relationship between the relative dielectric constant $\epsilon_{11}^s/\epsilon_0$ of the piezoelectric material constituting the surface acoustic wave substrate 2 and the aperture y in the IDTs, 3 and 4. The solid curved lines, A and B, were obtained by approximating the lines to the upper and lower limits of a set of points having a good filter characteristic which were measured as in the above. When the solid line A in FIG. 5 is expressed by a formula, it becomes y=0.945+5.49×exp(−E/366), and the solid line B becomes y=2.46×exp(−E/219), where E=$\epsilon_{11}^s/\epsilon_0$.

Accordingly, from the result of FIG. 5, it is understood that when the electrode finger aperture y in the IDTs, 3 and 4, is in the range where the above formula (1) is met, excellent filter characteristics can be obtained.

In addition, all of the curved solid lines, A and B, in the following FIGS. 6 through 12 were obtained by approximating the lines to the portions along the upper and lower limits of the sets of the measured points.

Figure 6:
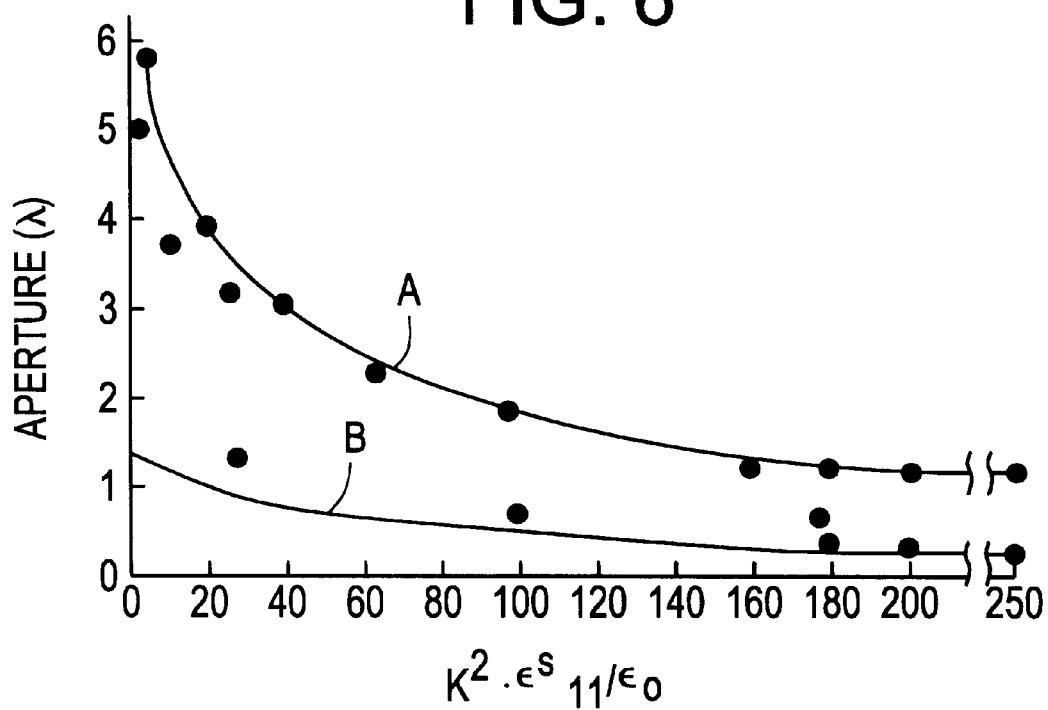
FIG. 6 shows the relationship between $K^2 \cdot \varepsilon^s_{11}/\varepsilon_0$ and the aperture length in a transversely coupled resonator type surface acoustic wave filter.

FIG. 6 shows the relationship between the product $K^2 \cdot \epsilon_{11}^s/\epsilon_0$ of the electromechanical coupling coefficient $K^2$ and the relative dielectric constant $\epsilon_{11}^s/\epsilon_0$ of the piezoelectric material constituting a surface acoustic wave substrate 2 and the electrode finger aperture in the IDTs, 3 and 4. The solid line A in FIG. 6 is expressed by a formula of y=1.40+4.14×exp(−F/46), and the solid line B is expressed by y=0.25+0.97×exp(−F/42). Therefore, from FIG. 6, it is understood that when the electrode finger aperture y is in the range where formula (2) is satisfied, excellent filter characteristic can be obtained.

More, although it is stated in U.S. Pat. No. 5,708,403 that in an end surface reflection resonator using a BGS wave produced in a PZT substrate, an optiimum aperture is in the range of 2.8λ to 3.1λ, it was confirmed that the optimum apertures of resonators and filters are different and they do not overlap.

Figure 7:
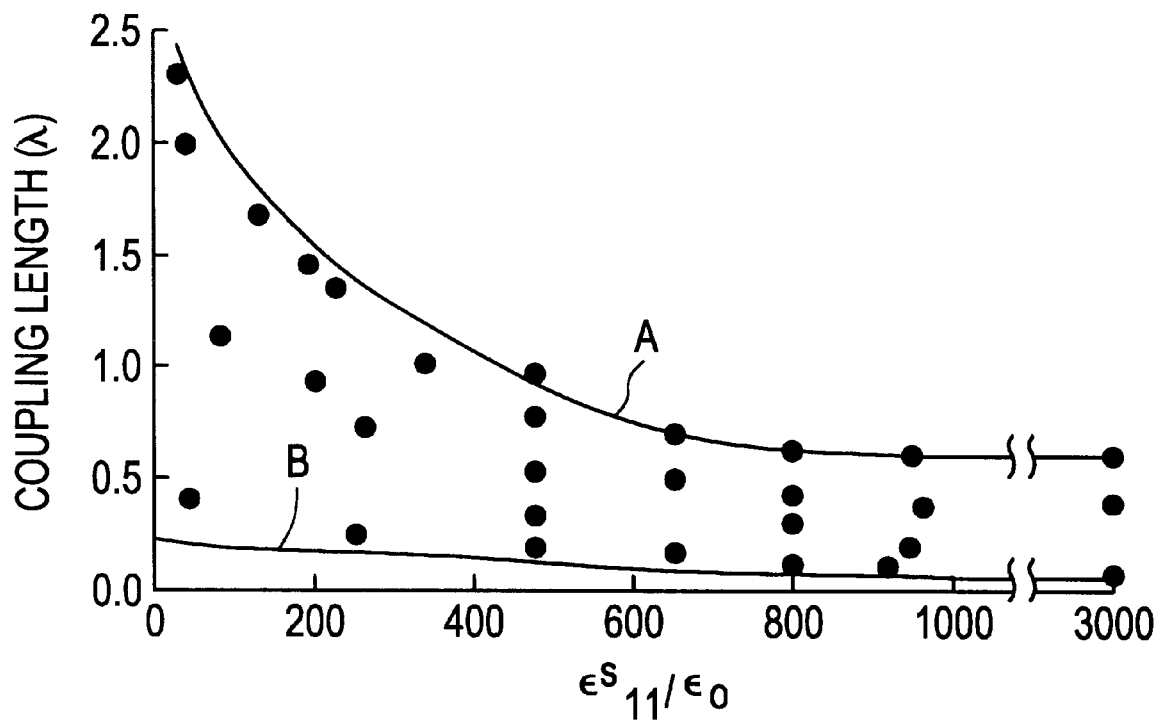
FIG. 7 shows the relationship between the relative dielectric constant $\varepsilon^s_{11}/\varepsilon_0$ and the coupling length in a transversely coupled resonator type surface acoustic wave filter.

FIG. 7 shows the relative dielectric constant $\epsilon_{11}^s/\epsilon_0$ of the piezoelectric material constituting a surface acoustic wave substrate 2 and the coupling length x. The solid line A of FIG. 7 is expressed by a formula of x=0.71+1.72×exp(−E/251), and the solid line B is expressed by x=0.045+0.16×exp(−E/418) Therefore, it is understood that when a filter is constructed so that the coupling length x satisfies formula (3), excellent filter characteristics can be obtained.

Figure 8:
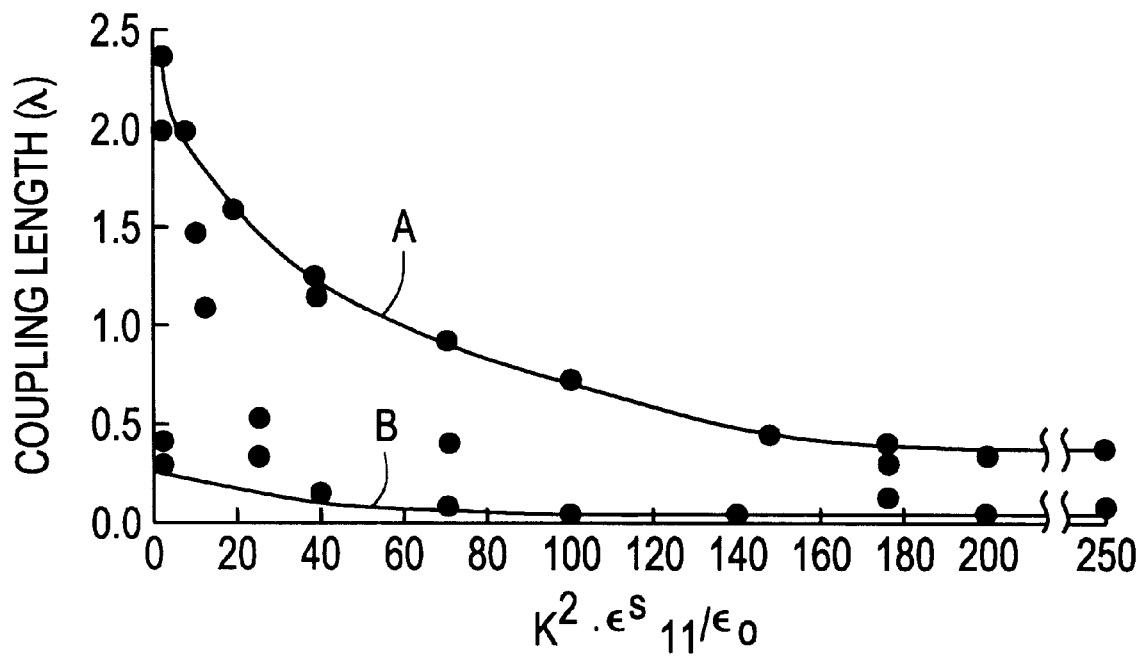
FIG. 8 shows the relationship between $K^2 \cdot \varepsilon^s_{11}/\varepsilon_0$ and the coupling length in a transversely coupled resonator type surface acoustic wave filter.

FIG. 8 shows the relationship between $K^2 \cdot \epsilon_{11}^s$ and the coupling length x. The solid line A in FIG. 8 is expressed by a formula of x=0.452+1.953×exp(−F/49.56), and the solid line B is expressed by a formula of x=0.269×exp(−F/32) Accordingly, from FIG. 8, it is understood that when the coupling length x is in the range where the formula (4) is satisfied, excellent filter characteristics can be obtained.

Further, FIG. 9 shows the relationship between the relative dielectric constant $\epsilon_{11}^s/\epsilon_0$ of the dielectric material constituting a surface acoustic wave substrate 2 and the width W of a common bus bar 7. The solid line A of FIG. 9 is expressed by a formula of width of common bus bar W=0.32+0.853×exp (−E/222), and the solid line B is expressed by formula W=0.017+0.157×exp (−E/245) Accordingly, regarding the width of a common bus bar, it is understood that when a filter is constructed so as to satisfy formula (5), excellent filter characteristics can be obtained.

FIG. 10 shows the relationship between $K^2 \cdot \epsilon_{11}^s/\epsilon_0$ and a common bus bar 7. The solid line A is expressed by a formula of W=0.22+0.84×exp (−F/43), and the solid line B is expressed by formula W=0.03+0.14×exp (−F/21) Accordingly, from FIG. 10, it is understood that when the width W of a common bus bar is set to satisfy the formula (6), excellent filter characteristics can be obtained.

Figure 11:
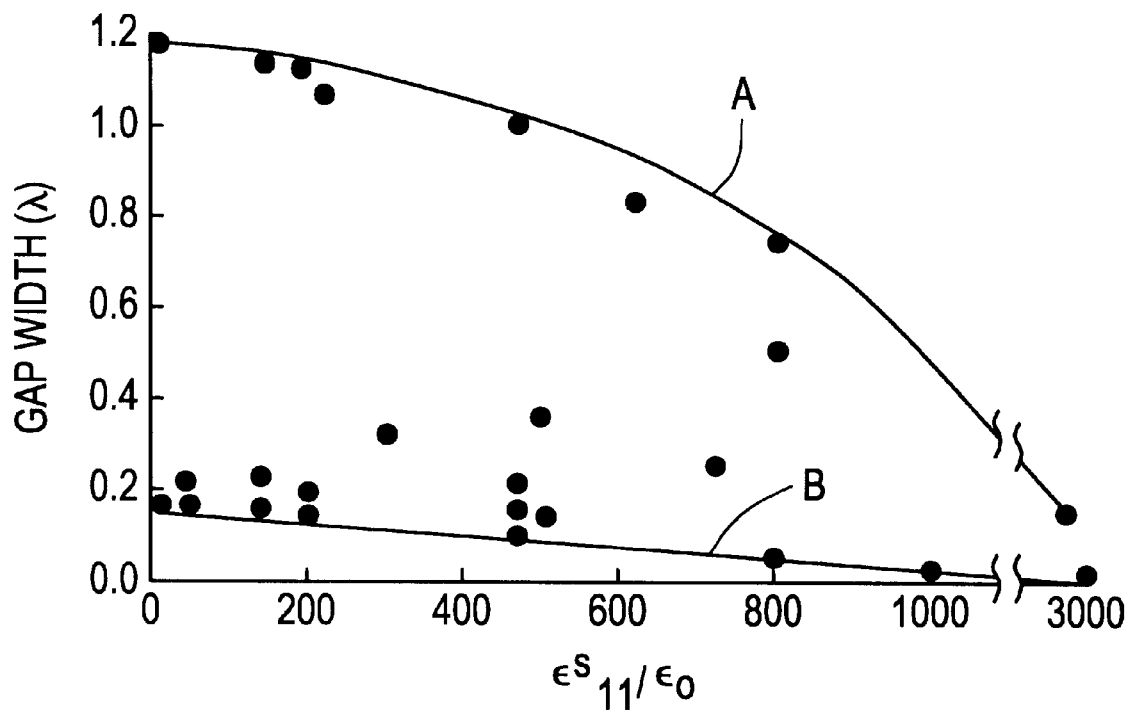
FIG. 11 shows the relationship between the relative dielectric constant $\varepsilon^s_{11}/\varepsilon_0$ and the gap width G in a transversely coupled resonator type surface acoustic wave filter.

FIG. 11 shows the relationship between the relative dielectric constant $\epsilon_{11}^s/\epsilon_0$ of the dielectric material constituting a surface acoustic wave substrate 2 and a gap width of G. The solid line A of FIG. 11 is expressed by a formula of G=1.19+4.51×10$^{-4}$×E−1.34×10$^{-6}$×E$^2$, and the solid line B is expressed by G=−0.115+0.29×exp(−E/1150) Accordingly, as clearly seen from FIG. 11, by setting the gap width G so as to satisfy the formula (7), excellent filter characteristics can be obtained.

Figure 12:
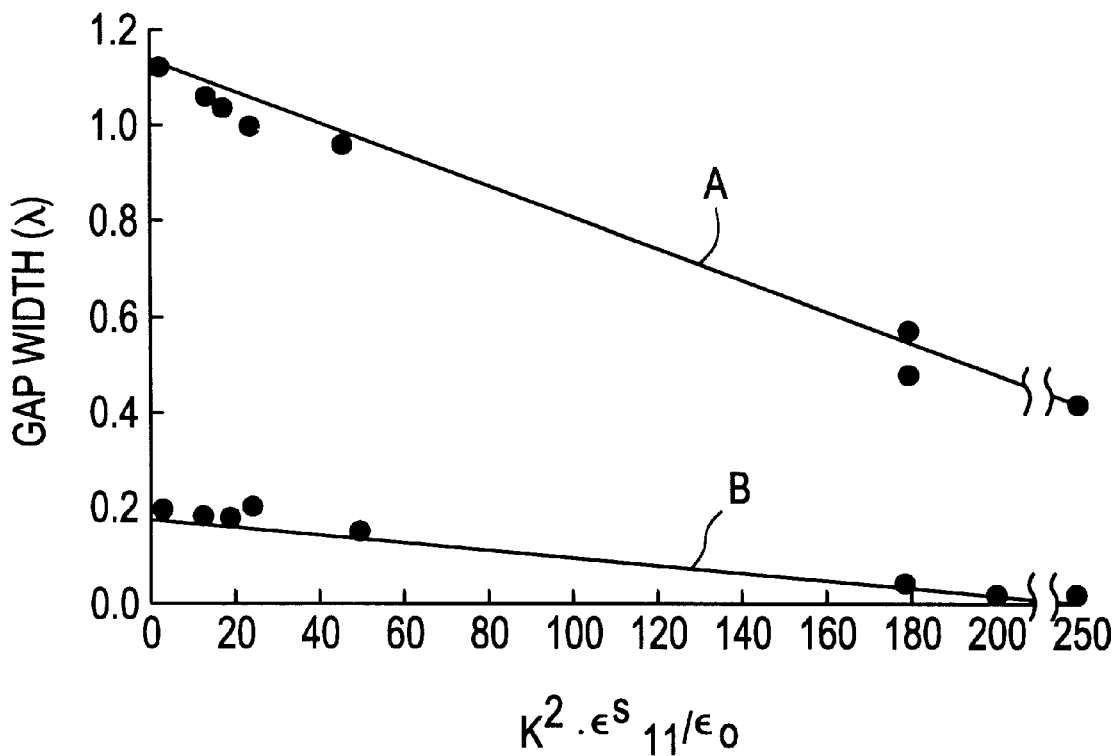
FIG. 12 shows the relationship between $K^2 \cdot \varepsilon^s_{11}/\varepsilon_0$ and the gap width G in a transversely coupled resonator type surface acoustic wave filter.

FIG. 12 shows the relationship between $K^2 \cdot \epsilon_{11}^s/\epsilon_0$ and a gap width G. The solid line of FIG. 12 is expressed by a formula of G=1.129−0.003×F−1.016×10$^-$×F$^2$, and the solid line B is expressed by G=−0.107+0.26×exp(−F/25). Therefore, by selecting a gap width G so as to satisfy the formula (8), excellent filter characteristics can be obtained.

From FIGS. 5 through 12, it is understood that by arranging the relationship between the relative dielectric constant $\epsilon_{11}^s/\epsilon_0$ and $K^2 \cdot \epsilon_{11}^s/\epsilon_0$ and the electrode finger aperture y, coupling length x, width of a common bus bar 7, and above gap width, in the range shown in the drawings, excellent characteristics can be obtained.

More, in the transversely coupled filter, the same result can be obtained by constructing the filter using reflectors provided on the surface acoustic wave substrate so as to interpose the first and second IDTs, instead of edge reflection type structures.

Figure 13:
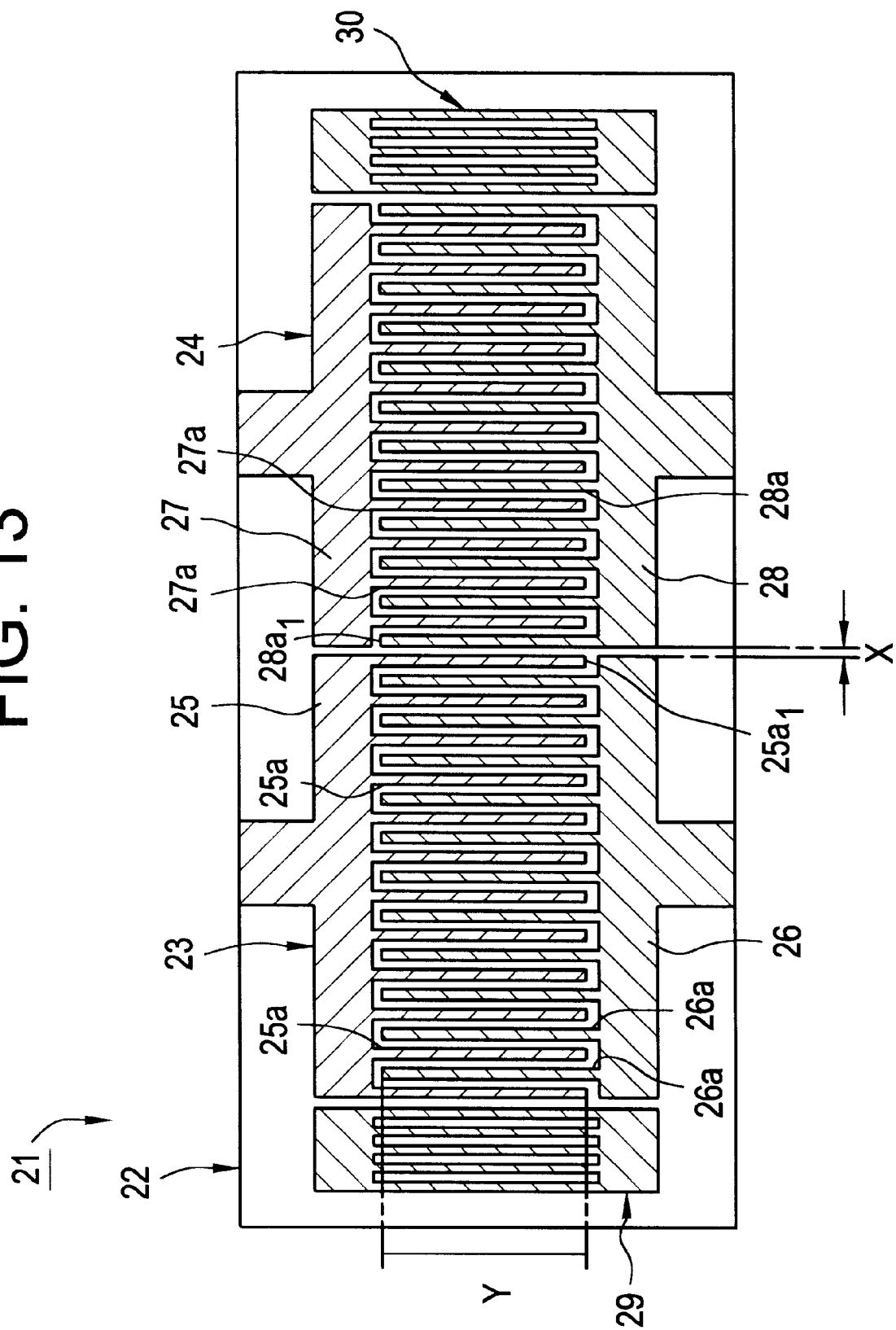
FIG. 13 is a plan view of a longitudinally coupled resonator type surface acoustic wave filter according to a second preferred embodiment of the present invention.

FIG. 13 is a plan view showing a longitudinally coupled resonator type surface acoustic wave filter making use of a BGS wave as a second preferred embodiment of the present invention.

A resonator type surface acoustic wave filter 21 is constructed using a substantially rectangular surface acoustic wave substrate 22. The surface acoustic wave substrate 22 can be constructed using the same piezoelectric material as in the surface acoustic wave substrate 2, and the surface acoustic wave substrate 22 may be constructed by forming a thin film of ZnO thin film, and so on, on various substrates. In fact, in the present preferred embodiment, in order to obtain excellent filter characteristics, the relationship between the relative dielectric constant $\epsilon_{11}^s/\epsilon_0$ and $K^2 \cdot \epsilon_{11}^s/\epsilon_0$ and the aperture, number of pairs of electrodes, and distance between fingers is preferably in the range shown in FIGS. 14 through 19.

On the surface acoustic wave substrate 22, first and second IDTs, 23 and 24, are arranged to extend along the surface acoustic wave transmission direction. The IDT 23 includes a pair of bus bars, 25 and 26. The pair of bus bars, 25 and 26, are extended in the surface acoustic wave transmission direction. A plurality of electrode fingers 25a are connected to the bus bar 25, and a plurality of electrode fingers 26a are connected to the bus bar 26. The electrode fingers 25a and electrode fingers 26a are arranged so as to be interdigitated with each other. That is, the IDT 23 includes a first comb electrode made up of the bus bar 25 and the plurality of electrode fingers 25a and a second comb electrode made up of the bus bar 26 and the electrode fingers 26a.

Similarly, the IDT 24 includes a pair of bus bars, 27 and 28, extending in the surface acoustic wave transmission direction respectively, a plurality of electrode fingers 27a connected to the bus bar 27, and a plurality of electrode fingers 28a connected to the bus bar 28.

Reflectors 29 and 30 are arranged outside of the area occupied by the IDTs 23 and 24 and to extend in the surface acoustic wave transmission direction. The reflectors, 29 and 30, have a construction in which both ends of a plurality of electrode fingers extending in the direction normal to the surface acoustic wave transmission direction are short-circuited.

In the resonator type surface acoustic wave filter of longitudinal type 21 of the present preferred embodiment, an input signal is applied between the bus bars, 25 and 26, of the one IDT 23, so that a BSG wave is resonated in the IDTs, 23 and 24, and an output signal based on the BGS wave confined between the reflectors, 29 and 30, is taken out from the bus bars, 27 and 28, in the IDT. In this case, because the IDTs, 23 and 24, are set to be in close vicinity to each other in the surface acoustic wave transmission direction, they function as a longitudinally coupled resonator type surface acoustic wave filter. More, the distance between the IDTs, 23 and 24, that is, the distance between the center lines of the electrode finger $25a_1$ and electrode finger $28a_1$, the closest to each other of the IDTs, 23 and 24, becomes a coupling length x.

Because the resonator type surface acoustic wave filter 21 of the present preferred embodiment is produced so as to satisfy the above-described relationship between the relative dielectric constant $\varepsilon^s_{11}/\varepsilon_0$ and $K^2 \cdot \varepsilon^s_{11}/\varepsilon_0$ and the electrode aperture, number of pairs, and because the distance between fingers satisfies the conditions shown in FIGS. 14 through 19, a filter having very small filter loss and excellent filter characteristics is obtained.

Accordingly, although in the longitudinally coupled resonator filter of a Rayleigh wave type using quartz, the number of pairs of electrode fingers of the IDT is preferably about 200 to about 300, in the present preferred embodiment it is understood that the number of pairs of electrode fingers may be less.

Further, by making the number of pairs of electrode fingers in the IDTs, 23 and 24, less than 110, excellent resonance characteristics can be obtained. That is explained based on the following experimental example.

Figure 14:
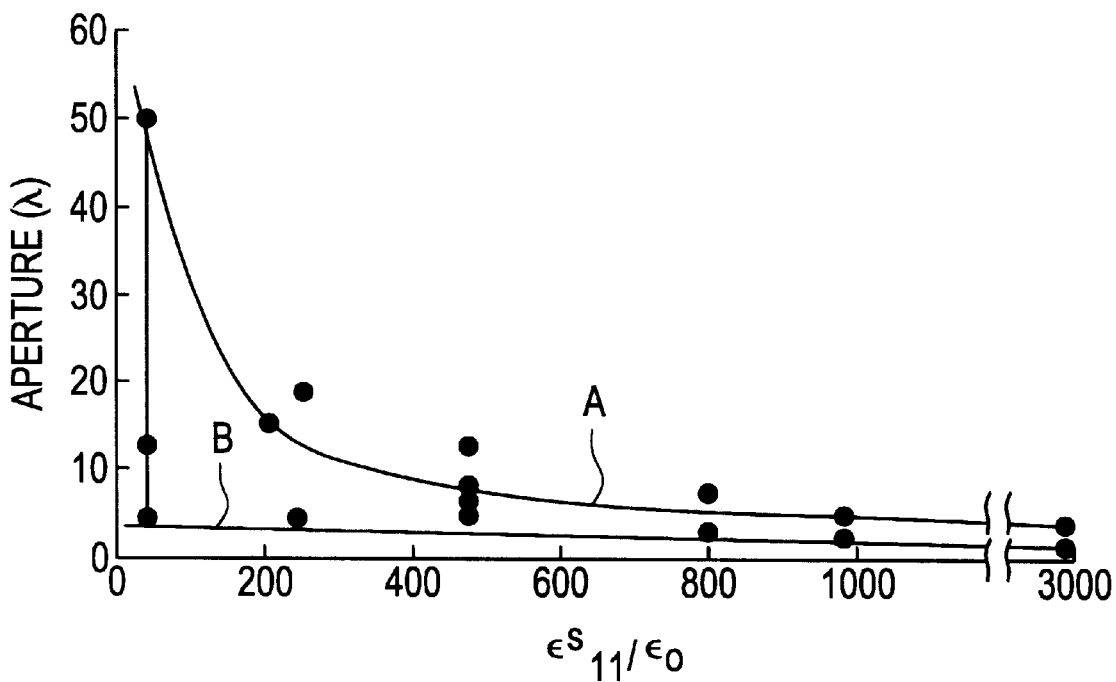
FIG. 14 shows the relationship between the relative dielectric constant $\varepsilon^s_{11}/\varepsilon_0$ and the aperture length of the electrode fingers in a longitudinally coupled resonator type surface acoustic wave filter.

FIG. 14 shows the relationship between the relative dielectric constant $\varepsilon^s_{11}/\varepsilon_0$ of the piezoelectric material constituting the surface acoustic wave substrate 22 and the aperture Y in the IDTs, 23 and 24. The solid lines, A and B, of FIG. 14 are the lines approximated to the upper and lower limits of a set of measured points as explained earlier. The solid line A of FIG. 14 is expressed by a formula of Y=5.52+66.62×exp (−E/110), and the solid line B is expressed by Y=0.80+3.48×exp (−E/404) Accordingly, by setting the aperture Y so as to satisfy the above-mentioned formula (9), excellent characteristics can be obtained. In addition, in the case of a longitudinally coupled resonator, the optimum apertures of the resonator and filter are different from each other as in the case of a transversely coupled resonator.

Both of the solid lines, A and B, in FIGS. 15 through 19 are the lines obtained by approximating to the portions along the upper and lower limits of a set of measurement points.

Figure 15:
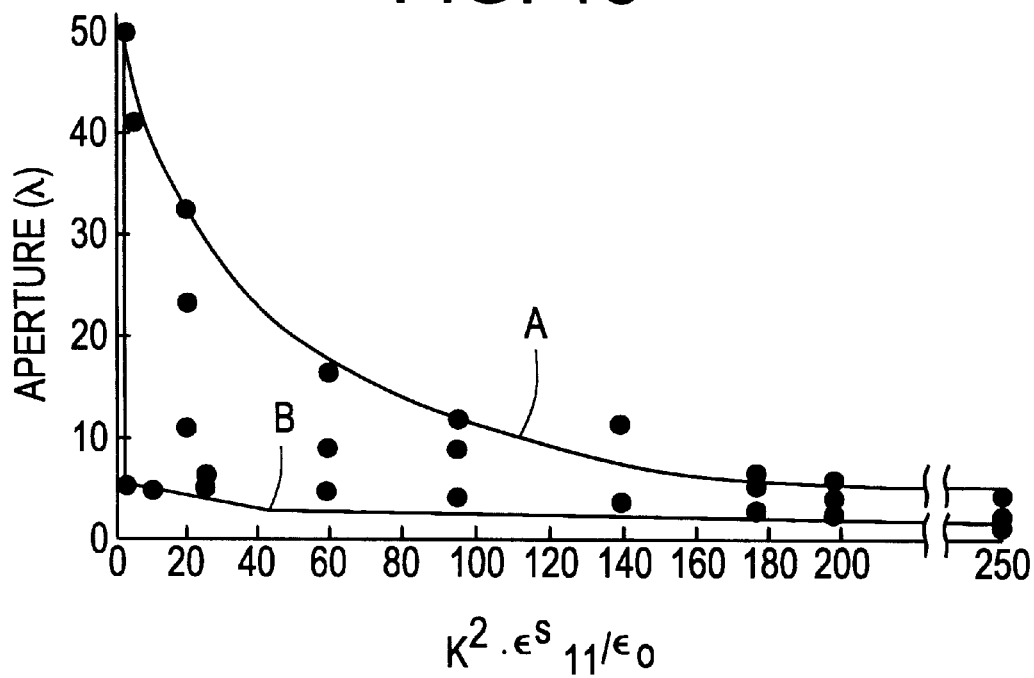
FIG. 15 shows the relationship between $K^2 \cdot \varepsilon^s_{11}/\varepsilon_0$ and the aperture length of electrode fingers in a longitudinally coupled resonator type surface acoustic wave filter.

FIG. 15 shows the relationship between the product $K^2 \cdot \varepsilon^s_{11}/\varepsilon_0$ of the electromechanical coupling coefficient $K^2$ and relative dielectric constant $\varepsilon^s_{11}/\varepsilon_0$ of the piezoelectric material constituting the surface acoustic wave substrate 22 and the electrode finger aperture Y in the IDTs, 3 and 4. The solid line A of FIG. 15 is expressed by a formula of Y=7.96+44.14×exp (−F/38.3), and the solid line B is expressed by Y=0.40+4.35×exp (−F/80) Accordingly, as clearly understood from FIG. 15, by setting the aperture Y so as to satisfy the above formula (10), excellent filter characteristics can be obtained.

Figure 16:
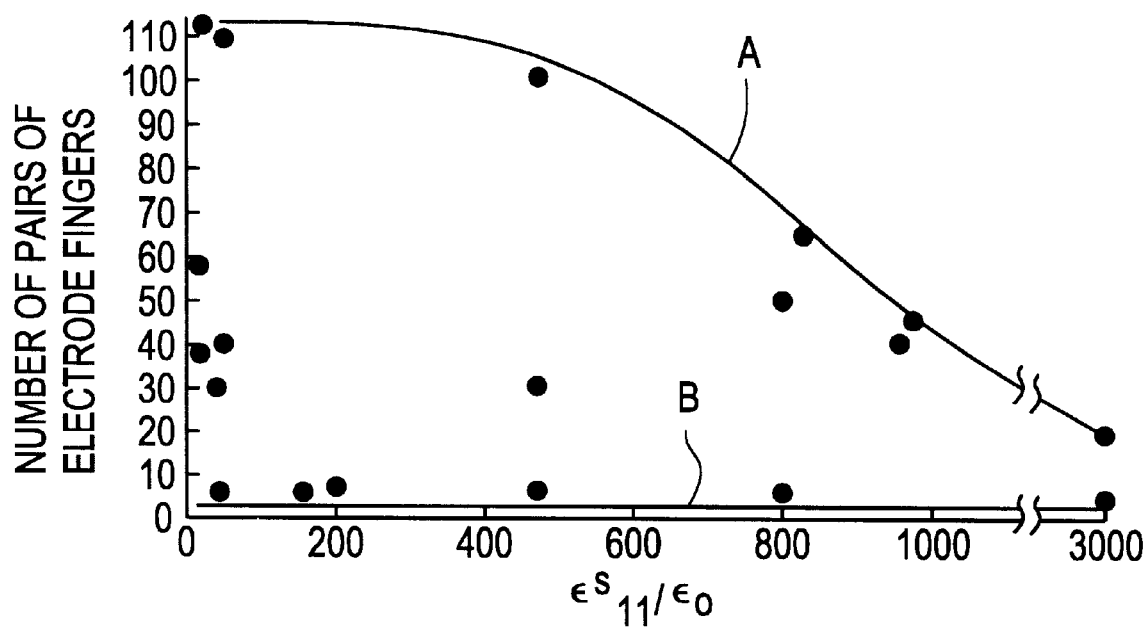
FIG. 16 shows the relationship between the relative dielectric constant $\varepsilon^s_{11}/\varepsilon_0$ and the number of pairs of the electrode fingers in the IDT of a longitudinally coupled resonator type surface acoustic wave filter.
Figure 17:
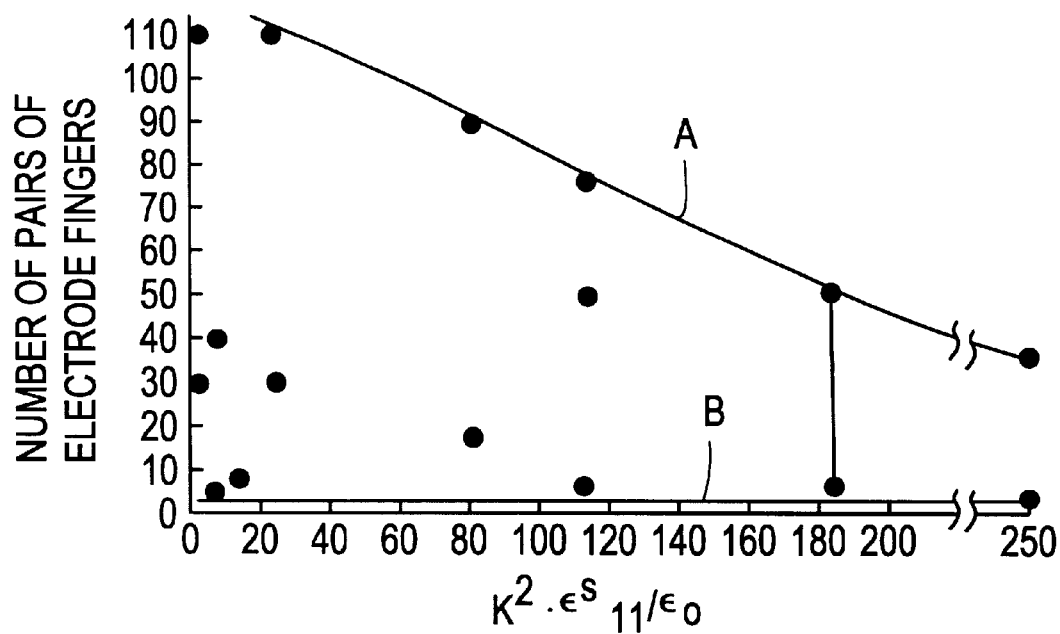
FIG. 17 shows the relationship between $K^2 \cdot \varepsilon^s_{11}/\varepsilon_0$ and the number of pairs of electrode fingers in the IDT of a longitudinally coupled resonator type surface acoustic wave filter.

FIG. 16 shows the relationship between the relative dielectric constant $\varepsilon^s_{11}/\varepsilon_0$ of the piezoelectric material constituting the surface acoustic wave substrate 22 and the number of pairs of the electrode fingers in the IDTs, 23 and 24, and FIG. 17 shows the relationship between $K^2 \cdot \varepsilon^s_{11}/\varepsilon_0$ and the number N of pairs of the electrode fingers in the IDTs, 23 and 24. The solid line B of FIG. 16 is expressed by a formula of N=2.0, and the solid line A is expressed by N=114.4+0.02×E−9.283×10$^{-5}$×E$^{-2}$. Accordingly, by setting the number of pairs of electrode fingers so as to satisfy the above formula (11), as clearly understood from FIG. 16, excellent filter characteristics can be obtained.

Similarly, the solid line B of FIG. 17 corresponds to N=2.0, and the solid line A is expressed by N=−171+292×exp (−F/672) Accordingly, by setting the number N of pairs of electrode fingers so as to satisfy the above-mentioned formula (12), excellent filter characteristics can be obtained.

Figure 18:
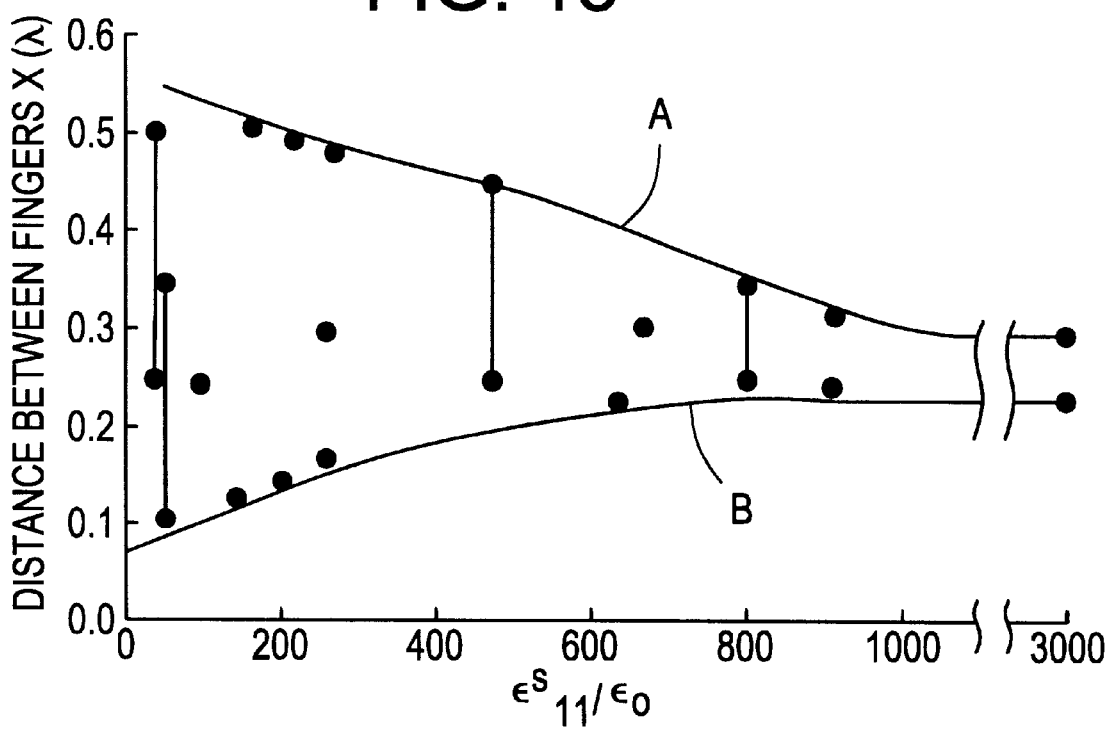
FIG. 18 shows the relationship between the relative dielectric constant $\varepsilon^s_{11}/\varepsilon_0$ and the distance between the electrode fingers in a longitudinally coupled resonator type surface acoustic wave filter.
Figure 19:
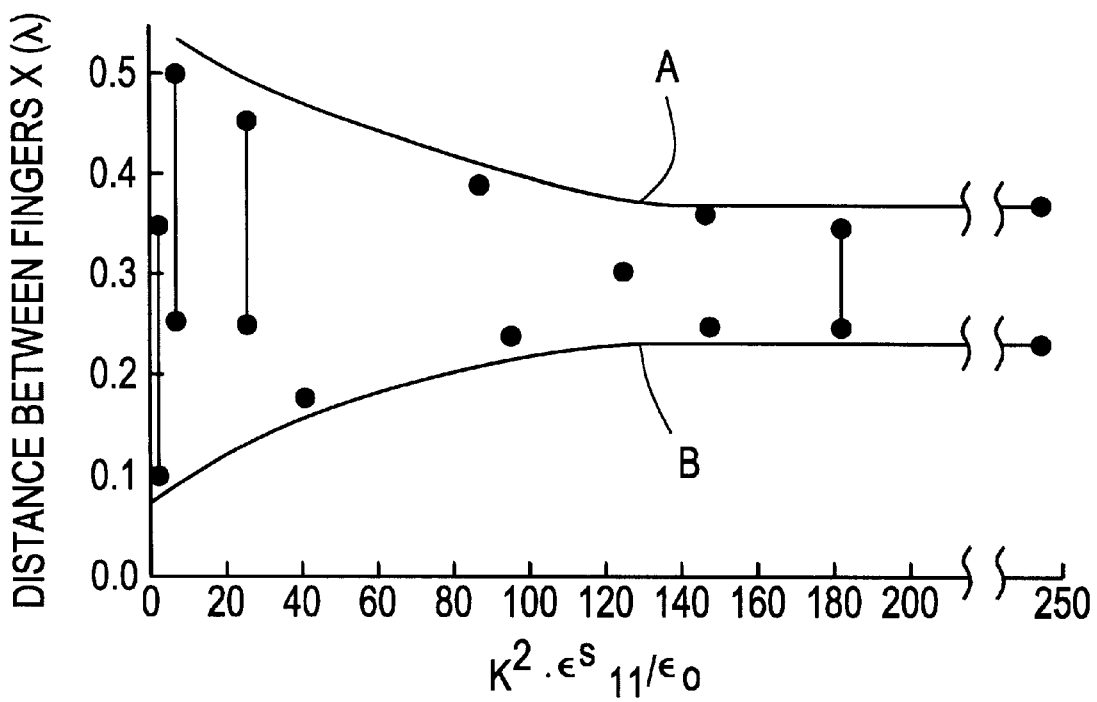
FIG. 19 shows relationship between $K^2 \cdot \varepsilon^s_{11}/\varepsilon_0$ and the distance between the electrode fingers in a longitudinally coupled resonator type surface acoustic wave filter.

FIG. 18 shows the relationship between the relative dielectric constant $\varepsilon^s_{11}/\varepsilon_0$ of the piezoelectric material constituting the surface acoustic wave substrate 22 and the distance X between adjacent electrode fingers of the first and second IDTs, and FIG. 19 shows the relationship between $K^2 \cdot \varepsilon^s_{11}/\varepsilon_0$ and the distance X between electrode fingers. The solid line A of FIG. 18 becomes X=−5.423+5.994×exp (−E/22894), and the solid line B becomes X=0.255+0.19×exp (−E/446) Therefore, by setting the distance X between electrode fingers so as to satisfy formula (13), excellent filter characteristic can be obtained.

Similarly, the solid line A of FIG. 19 becomes X=0.364+0.198×exp (−F/67.5), and the solid line B becomes X=0.241−0.169×exp (−F/58.1) Accordingly, by setting the distance X between electrode fingers so as to satisfy the above formula (14), excellent filter characteristics can be obtained.

From FIGS. 15 through 19, it is understood that by variously changing the electrode finger aperture, distance between adjacent electrode fingers of the first and second IDTs, and number of pairs of electrode fingers in accordance with the value of the relative dielectric constant $\varepsilon^s_{11}/\varepsilon_0$ or $K^2 \cdot \varepsilon^s_{11}/\varepsilon_0$ of the surface acoustic wave substrate, excellent resonance characteristics can be obtained.

It is to be noted that FIG. 13 depicts the longitudinally coupled resonator type surface acoustic wave filter having a pair of reflectors, but the present invention can also be applied to an edge reflection longitudinally coupled resonator type surface acoustic wave filter.

Further, in the filter according to first or second preferred embodiment of the present invention, the IDT may be divided into a plurality of sub-IDT portions connected in series with each other.

The present invention can be suitably applied to various electronic components, apparatuses or devices utilizing a surface acoustic wave filter in which the unique features of the present invention are successfully used. For example, the present invention may be applied to a duplexer and communication apparatus including the duplexer.

FIG. 20 is a block diagram of a communication apparatus 50 having a duplexer 40. The communication apparatus 50 may be a cellular phone, for example, because a cellular phone which usually requires a small hand-held body and a high efficiency is suitable to enjoy the aforementioned merits of the filter according to various preferred embodiments of the present invention.

The communication apparatus 50 preferably includes duplexer 40, an antenna 51, a receiver 52 and a transmitter 53. The duplexer 40 preferably includes a SAW filter 41 and a SAW filter 42, and one end of each of the SAW filter 41 and the SAW filter 42 are connected in parallel to define a first terminal 43. The other ends of the SAW filter 41 and the SAW filter 42 are connected to a second terminal 44 and a third terminal 45. The SAW filter 41 and the SAW filter 42 may be any one of the SAW filters explained in the aforementioned examples. The antenna 51, the receiver 52 and the transmitter 53 are connected to the first terminal 43, the second terminal 44 and the third terminal 45 of the duplexer 40.

The pass bands of the SAW filters 41 and 42 of the duplexer 40 are selected such that the signals received through the antenna 51 passes through the SAW filter 41 and are blocked by the SAW filter 42 and that the signals to be transmitted from the transmitter 53 passes through the SAW filter 42.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A transversely coupled resonator type surface acoustic wave filter comprising:

a surface acoustic wave substrate having opposing first and second end surfaces; and first and second surface acoustic wave resonators on the surface acoustic wave substrate, and which are arranged to generate a surface acoustic wave having an SH wave as a main component, the first and second surface acoustic wave resonators being coupled to define a stage of the transversely coupled resonator filter;

wherein the first and second surface acoustic wave resonators include first and second interdigital transducers, the first and second interdigital transducers defined by a first bus bar, a second bus bar and a common bus bar all arranged so as to be substantially parallel to each other and extending in a direction of transmission of the surface acoustic wave, the common bus bar is located between the first and second bus bars, and a plurality of electrode fingers are connected to the first and second bus bars at a first end of the electrode fingers and extended towards the common bus bar, a plurality of electrode fingers are connected to the common bus bar at a first end of the electrode fingers and such that a first set of electrode fingers of the common bus bar are extended towards the first bus bar and a second set of electrode fingers are extended towards the second bus bar so that the first and second sets of electrode fingers of the common bus bar interdigitate with the electrode fingers of the first and second bus bars, respectively; wherein the surface acoustic wave substrate has a relative dielectric constant E such that $E=\epsilon^s_{11}/\epsilon_0$, and where E is in a range of about 0 to about 3000;

an aperture y of the interdigital transducer is defined as an amount of overlap between the electrode fingers of the common bus bar with the electrode fingers of the first and second bus bars normalized by a wavelength $\lambda$ of the surface acoustic wave; and the filter is constructed such that y satisfies a formula:

$$0.945 + 5.49 \times \exp(-E/366) \geq y \geq 2.46 \times \exp(-E/219) \quad (1).$$

2. The filter of claim 1, further comprising reflectors which are made of an electrode material and disposed on the surface acoustic wave substrate so as to be interposed by the first and second interdigital transducers.

3. The filter of claim 1, wherein a coupling length x is defined as an amount of separation between a second end of the electrode fingers of the first and second bus bars normalized by the wavelength $\lambda$ of the surface acoustic wave, respectively, and wherein x satisfies a formula:

$$0.71 + 1.72 \times \exp(-E/251) \geq x \geq 0.045 + 0.16 \times \exp(-E/418) \quad (3).$$

4. The filter of claim 1, further comprising a plurality of stages.

5. The filter of claim 1, wherein a width of the common bus bar W satisfies a formula:

$$0.32 + 0.853 \times \exp(-E/222) \geq W \geq 0.017 + 0.157 \times \exp(-E/245) \quad (5).$$

6. A duplexer comprising a pair of surface acoustic wave filters according to claim 1.

7. A communications apparatus comprising a duplexer according to claim 6.

8. The filter of claim 1, wherein a gap width G is defined as an amount of separation between a second end of the electrode fingers of the first and second bus bars, and the common bus bar, and wherein G satisfies a formula:

$$1.19 + 4.51 \times 10^{-4} \times E - 1.34 \times 10^{-6} \times E^2 \geq G \geq -0.115 + 0.29 \times \exp(-E/1150) \quad (7).$$

9. The filter of claim 1, wherein the filter is an edge reflection type surface acoustic wave filter which uses the opposing end surfaces of the surface acoustic wave substrate to reflect surface acoustic waves excited on the surface acoustic wave substrate.

10. A transversely coupled resonator type surface acoustic wave filter comprising:

a surface acoustic wave substrate having opposing first and second end surfaces; and first and second surface acoustic wave resonators on the surface acoustic wave substrate, and which are arranged to generate a surface acoustic wave having an SH wave as a main component, the first and second surface acoustic wave resonators being coupled to define a stage of the transversely coupled resonator filter;

wherein the first and second surface acoustic wave resonators include first and second interdigital transducers, the first and second interdigital transducers defined by a first bus bar, a second bus bar and a common bus bar all arranged so as to be substantially parallel to each other and extending in a direction of transmission of the surface acoustic wave, the common bus bar is located between the first and second bus bars, and a plurality of electrode fingers are connected to the first and second bus bars at a first end of the electrode fingers and extended towards the common bus bar, a plurality of electrode fingers are connected to the common bus bar at a first end of the electrode fingers and such that a first set of electrode fingers of the common bus bar are extended towards the first bus bar and a second set of electrode fingers are extended towards the second bus bar so that the first and second sets of electrode fingers of the common bus bar interdigitate with the electrode fingers of the first and second bus bars, respectively; wherein the surface acoustic wave substrate has a relative dielectric constant $E = \epsilon^s_{11}/\epsilon_0$ and an electromechanical coupling coefficient K so that a product F of the relative dielectric constant and the electromechanical coupling coefficient $F = K^2 \cdot \epsilon^s_{11}/\epsilon_0$, is in a range of about 0 to about 250, and an aperture y of the interdigital transducer is defined as an amount of overlap between the electrode fingers of the common bus bar with the electrode fingers of the first and second bus bars normalized by a wavelength $\lambda$ of the surface acoustic wave; and the filter is constructed such that y satisfies a formula:

$$1.40 + 4.14 \times \exp(-F/46) \geq y \geq 0.25 + 0.97 \times \exp(-F/42) \quad (2).$$

11. The filter of claim 10, wherein a coupling length x is defined as an amount of separation between a second end of the electrode fingers of the first and second bus bars normalized by the wavelength $\lambda$ of the surface acoustic wave, respectively, and wherein x satisfies a formula:

$$0.452 + 1.953 \times \exp(-F/49.56) \geq x \geq 0.269 \times \exp(-F/32) \quad (4).$$

12. The filter of claim 10, further comprising reflectors which are made of an electrode material and disposed on the surface acoustic wave substrate so as to be interposed by the first and second interdigital transducers.

13. The filter of claim 10, wherein a width of the common bus bar W satisfies a formula:

$$0.22 + 0.84 \times \exp(-F/43) \geq W \geq 0.03 + 0.14 \times \exp(-F/21) \quad (6).$$

14. The filter of claim 10, further comprising a plurality of stages.

15. The filter of claim 10, wherein a gap width G is defined as an amount of separation between a second end of the electrode fingers of the first and second bus bars, and the common bus bar, and wherein G satisfies a formula:

$$1.125 - 0.003 \times F - 1.016 \times 10^{-6} \times F^2 \geq G \geq -0.107 + 0.26 \times \exp(-F/250) \quad (8).$$

16. The filter of claim 10, wherein the filter is an edge reflection type surface acoustic wave filter which uses the opposing end surfaces of the surface acoustic wave substrate to reflect surface acoustic waves excited on the surface acoustic wave substrate.

17. A duplexer comprising a pair of surface acoustic wave filters according to claim 10.

18. A communications apparatus comprising a duplexer according to claim 17.

19. A longitudinally coupled resonator type surface acoustic wave filter comprising:

a surface acoustic wave substrate having opposing first and second end surfaces, and first and second surface acoustic wave resonators on the surface acoustic wave substrate and arranged to generate a surface acoustic wave having an SH wave as a main component, the first and second surface acoustic wave resonators being coupled to constitute a stage of the longitudinally coupled resonator filter;

wherein the first and second surface acoustic wave resonators include first and second interdigital transducers arranged in the direction of transmission of the surface acoustic wave on the surface acoustic wave substrate, respectively, and each of the interdigital transducers defined by first and second comb electrodes having a first bus bar and a second bus bar, respectively, and such that the bus bars extend in the direction of transmission of the surface acoustic wave, and each of the bus bars is connected to a first end of a plurality of electrode fingers such that a second end of the electrode fingers of the first bus bar extends towards the second bus bar and a second end of the electrode fingers of the second bus bar extend towards the first bus bar such that the electrode fingers of the first and second bus bars interdigitate with each other; wherein the surface acoustic wave substrate has a relative dielectric constant E such that $E = \epsilon^s_{11}/\epsilon_0$, and where E is in a range of about 0 to about 3000;

an aperture Y is defined as an amount of overlap between the electrode fingers of the first bus bar and the second bus bar normalized by a wavelength $\lambda$ of the surface acoustic wave; and Y satisfies a formula:

$$5.52 + 66.62 \times \exp(-E/110) \geq Y \geq 0.80 + 3.48 \times \exp(-E/404) \quad (9).$$

20. The filter of claim 19, wherein a number of pairs of the electrode fingers N of the first and second interdigital transducers satisfies a formula:

$$114.4 + 0.02 \times E - 9.283 \times 10^{-5} \times E^2 \geq N \geq 2.0 \quad (11).$$

21. The filter of claim 19, further comprising a plurality of stages.

22. The filter of claim 19, wherein a distance X, which is defined by an amount of separation between the electrode fingers of the first and second transducers located adjacent to each other, satisfies a formula:

$$-5.423 + 5.994 \times \exp(-E/22894) \geq X \geq 0.255 - 0.19 \times \exp(-E/446) \quad (13).$$

23. The filter of claims 19, wherein the filter is an edge reflection type surface acoustic wave filter which uses the opposing first and second end surfaces of the surface acoustic wave substrate to reflect surface acoustic waves excited on the surface acoustic wave substrate.

24. The filter of claim 19, further comprising reflectors which are made of an electrode material and disposed on the surface acoustic wave substrate so as to be interposed by the first and second interdigital transducers.

25. A duplexer comprising a pair of surface acoustic wave filters according to claim 19.

26. A communications apparatus comprising a duplexer according to claim 25.

27. A longitudinally coupled resonator type surface acoustic wave filter comprising:

a surface acoustic wave substrate having opposing first and second end surfaces; and first and second surface acoustic wave resonators on the surface acoustic wave substrate and arranged to generate a surface acoustic wave having an SH wave as a main component, the first and second surface acoustic wave resonators being coupled to constitute a stage of the longitudinally coupled resonator filter;

wherein the first and second surface acoustic wave resonators include first and second interdigital transducers arranged in the direction of transmission of the surface acoustic wave on the surface acoustic wave substrate, respectively, and each of the interdigital transducers defined by first and second comb electrodes having a first bus bar and a second bus bar, respectively, and such that the bus bars extend in the direction of transmission of the surface acoustic wave, and each of the bus bars is connected to a first end of a plurality of electrode fingers such that a second end of the electrode fingers of the first bus bar extends towards the second bus bar and a second end of the electrode fingers of the second bus bar extend towards the first bus bar such that the electrode fingers of the first and second bus bars interdigitate with each other; wherein the surface acoustic wave substrate has a relative dielectric constant $E = \epsilon^s_{11}/\epsilon_0$ and an electromechanical coupling coefficient K of the surface acoustic wave substrate so that a product of the relative dielectric constant and the electromechanical coupling coefficient $F = K^2 \cdot \epsilon^s_{11}/\epsilon_0$, is in a range of about 0 to about 250, an aperture Y is defined as an amount of overlap between the electrode fingers of the first bus bar and the second bus bar normalized by a wavelength $\lambda$ of the surface acoustic wave; and Y satisfies a formula:

$$7.96 + 44.14 \times \exp(-F/38.3) \geq Y \geq 0.40 + 4.35 \times \exp(-F/80) \quad (10).$$

28. The filter of claim 27, wherein a number of pairs of electrode fingers N of the first and second interdigital transducers satisfies a formula:

$$-171 + 292 \times \exp(-F/672) \geq N \geq 2.0 \quad (12).$$

29. The filter of claim 27, wherein a distance X, which is defined by an amount of separation between the electrode fingers of the first and second transducers located adjacent to each other each other, satisfies a formula:

$$0.364 + 0.198 \times \exp(-F/67.5) \geq X \geq 0.241 - 0.169 \times \exp(-F/58.1) \quad (14).$$

30. A duplexer comprising a pair of surface acoustic wave filters according to claim 27.

31. A communications apparatus comprising a duplexer according to claim 30.

32. The filter of claim 27, further comprising a plurality stages.

33. The filter of claim 27, wherein the filter is an edge reflection type surface acoustic wave filter which uses the opposing first and second end surfaces of the surface acoustic wave substrate to reflect surface acoustic waves excited on the surface acoustic wave substrate.

34. The filter of claim 27, further comprising reflectors which are made of an electrode material and disposed on the surface acoustic wave substrate so as to be interposed by the first and second interdigital transducers.

* * * * *